(12) United States Patent
Ueda

(10) Patent No.: US 7,619,264 B2
(45) Date of Patent: Nov. 17, 2009

(54) SEMICONDUCTOR DEVICE

(75) Inventor: Takehiro Ueda, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 303 days.

(21) Appl. No.: 11/514,143

(22) Filed: Sep. 1, 2006

(65) Prior Publication Data
US 2007/0052063 A1 Mar. 8, 2007

(30) Foreign Application Priority Data
Sep. 5, 2005 (JP) ............... 2005-256787

(51) Int. Cl.
H01L 29/80 (2006.01)
(52) U.S. Cl. ............ 257/209; 257/529; 257/665; 257/758
(58) Field of Classification Search ........... 257/209, 257/529, 665, 758
See application file for complete search history.

(56) References Cited

U.S. PATENT DOCUMENTS 6,872,648 B2 * 3/2005 Friese et al. ............ 438/601
7,282,751 B2 * 10/2007 Ueda ...................... 257/209
2007/0052515 A1 * 3/2007 Ueda ...................... 337/401

FOREIGN PATENT DOCUMENTS

JP 2005-039220 2/2005
JP 2005-057186 3/2005

* cited by examiner

Primary Examiner—Fernando L Toledo
(74) Attorney, Agent, or Firm—Young & Thompson

(57) ABSTRACT

An electric fuse includes a wide interconnect and a narrow interconnect. The electric fuse has a juxtaposed region in which a plurality of straight line portions are juxtaposed with each other by folding the wide interconnect, and the narrow interconnect has a narrower width than that of the wide interconnect, and, at the same time, is connected to the wide interconnect outside the juxtaposed region.

19 Claims, 21 Drawing Sheets

SEMICONDUCTOR DEVICE

This application is based on Japanese Patent Application NO. 2005-256787, the content of which is incorporated hereinto by reference.

RELATED APPLICATIONS

The following is a list of related applications:
application Ser. No. 10/865,796; application Ser. No. 12/368,659;
application Ser. No. 11/798,982; application Ser. No. 11/797,704;
application Ser. No. 11/806,553; application Ser. No. 11/798,221;
application Ser. No. 11/802,469; and application Ser. No. 11/749,241.

BACKGROUND OF THE INVENTION

1. Technical Field

The present invention relates to a semiconductor device, and, more particularly, to a semiconductor device including an electric fuse.

2. Related Art

Conventionally, there has been known a technology according to which a fuse is installed in a semiconductor device, the fuse is cut to adjust a resistance value used in the semiconductor device, to remove a defective element for replacement by a normal element, and the like.

In order to cut or disconnect a fuse, there has been used a method, by which a fuse is cut by irradiating a part of the fuse with beams of laser light, or a method of cutting a fuse by use of an electric current.

Japanese Laid-open patent publication No. 2005-39220 has disclosed a fuse which can be cut by a smaller current. In Japanese Laid-open patent publication No. 2005-39220, a conductive material forming the fuse is shaped to be folded up a plurality of times. FIG. 21 is a plan view showing the fuse disclosed in Japanese Laid-open patent publication No. 2005-39220. Here, a fuse 1100 is folded up twice.

The fuse 1100 includes a current flowing-in terminal 1101, and a current flowing-out terminal 1102, and further has a first one-way straight-line portion 1103, an another-way straight-line portion 1104, and a second one-way straight-line portion 1113 between the current flowing-in terminal 1101 and the current flowing-out terminal 1102. The fuse 1100 further includes a first right-angle connecting portion 1106 connecting the first one-way straight-line portion 1103 and the another-way straight-line portion 1104, and a second right-angle connecting portion 1107 connecting the second one-way straight-line portion 1113 and the another-way straight-line portion 1104.

In the fuse 1100 with the above-described configuration, when a predetermined current is applied to the current flowing-out terminal 1102 from the current flowing-in terminal 1101, cutting the another-way straight-line portion 1104 between the diagonally shaded portion 1109 is accelerated by adding heat generated in a diagonally shaded portion 1108 in the outer portion of the fuse 1100 to heat generated in the diagonally shaded portion 1109 in the inner portion of the fuse 1100. Thereby, the fuse 1100 is easily cut.

Moreover, Japanese Laid-open patent publication No. 2005-57186 has disclosed a configuration in which, when a current is applied to a fuse, heat generated in a portion of the fuse, which is to be cut, is trapped or accumulated in the neighborhood of the portion in the fuse, which is to be cut, by enclosing the portion with a plate.

In Japanese Laid-open patent publication No. 2005-39220 and Japanese Laid-open patent publication No. 2005-57186, a fuse is heated to melt a material forming the conductive material in the fuse, or a fuse is cut, using a movement phenomenon caused by electro-migration, when a current is applied to the fuse.

Incidentally, when a fuse is formed with a material which moves by the electro-migration, it may be considered that material movement by the electro-migration causes reconnection at a cut part when heat-treating of a semiconductor device is executed after the fuse is cut. If such reconnection is caused, a correct result will not be obtained at detecting whether the electric fuse is cut even if the electric fuse to be cut has been cut.

Though it is thought that a possibility that the above-described reconnection is caused is not so high, and there is no problem at ordinary use, it is required to improve a holding characteristic by which a state, in which an electric fuse is cut, is held, when demand for the higher reliability of a semiconductor device is much increased or when a semiconductor device is used under severe conditions, or the like.

SUMMARY OF THE INVENTION

According to the present invention, there is provided a semiconductor device, including: a semiconductor substrate; and an electric fuse which is formed on said semiconductor substrate, and includes a first interconnect and a second interconnect, wherein said electric fuse has a region in which a plurality of straight line portions are juxtaposed with each other by folding said first interconnect, and said second interconnect has a narrower width than that of said first interconnect and is connected to said first interconnect outside said region.

According to the semiconductor device of the present invention, material forming the fuse is easily heated in the region, in which a plurality of straight line portions are juxtaposed with each other by folding the first interconnect, when a current is applied to the electric fuse. On the other hand, as the second interconnect having a narrower width than that of the first interconnect is connected to the first interconnect outside the region, cutting may be executed on that location. According to the above-described configuration, cutting may be promoted by providing a location in which the electric fuse is easily heated, a location in which cutting is performed may be formed at a location different from a location which is easily heated, therefore a state in which the electric fuse is cut, may be preferably held.

According to the present invention, a state, in which an electric fuse is cut, is preferably held.

BRIEF DESCRIPTION OF DRAWINGS

The above and other objects, advantages and features of the present invention will be more apparent from the following description taken in conjunction with the accompanying drawings, in which.

DETAILED DESCRIPTION

Figure 1:
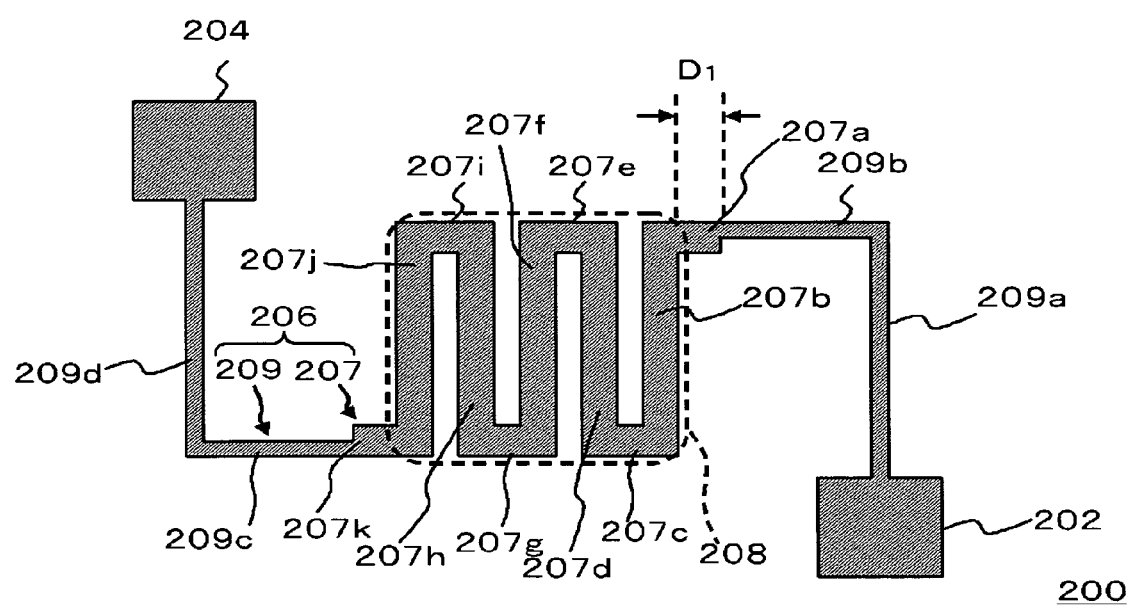
FIG. 1 is a plan view showing a configuration of an electric fuse included in a semiconductor device according to an embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Subsequently, embodiments according to the present invention will be explained, with reference to drawings. Here, similar components will be denoted by the same reference numbers all in the drawings, and detailed explanation will not be repeated.

The present inventor has found a new technology for cutting an electric fuse, according to which a material forming a fuse flows out from a region of the electric fuse, and, at the same time, the fuse is cut in a region different from the flowing-out region by applying excessive power to an electric fuse to be cut.

Here, the electric fuse may have a configuration in which the fuse is formed with, for example, a conductive member (conductive material), and the surrounding surface in the cross-sectional direction of the conductive member is covered with a coating layer. A current is applied to the electric fuse by applying excessive power to the electric fuse with the above-described configuration, and the fuse forming material is heated and expanded. When the fuse forming material is expanded, a crack and the like are generated on the surrounding coating layer. Furthermore, the fuse forming material is expanded, and is forced to flow out into the crack of the surrounding coating layer. As a result, movement and supply of the fuse forming material get out of balance each other, and a large cut part is formed at a region different from the region in which the fuse forming material has flown out. Hereinafter, cutting of an electric fuse according to the above-described technique is called, "crack assist type cutting".

In the first place, a mechanism for the crack assist type cutting will be explained.

Figure 4A:
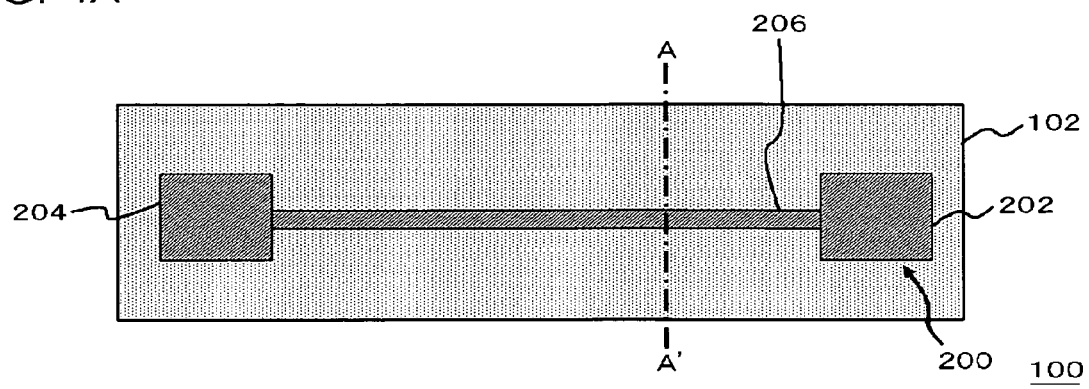
FIGS. 4A and 4B are plan views showing a configuration of the semiconductor device for explaining a mechanism according to a crack assist type cutting.
Figure 4B:
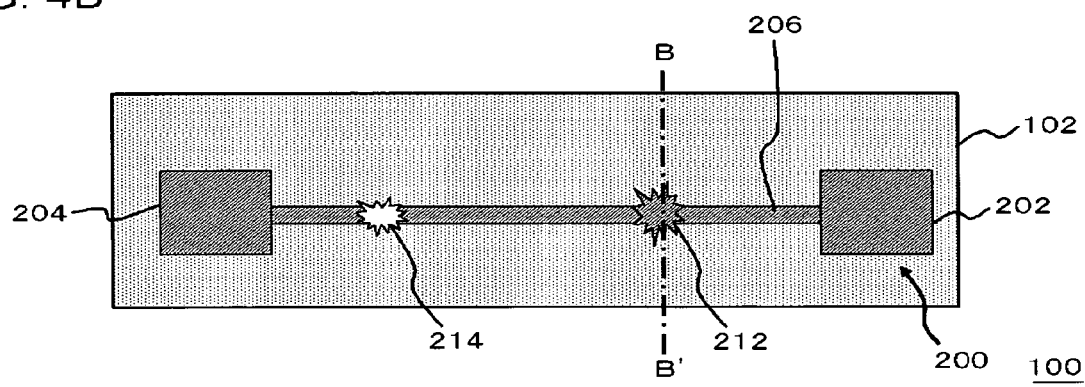

FIGS. 4A and 4B are plan views showing one example of a semiconductor device including an electric fuse.

A semiconductor device 100 includes: a semiconductor substrate (not shown); a first insulating layer 102 which is formed on the semiconductor substrate and is formed with concave portion at surface therof; and an electric fuse 200 formed on the first insulating layer 102. The electric fuse 200 has a conductive member 206, a first terminal 202 provided at one end, and a second terminal 204 provided at the other end thereof. The conductive member 206 is formed in such a way that it is embedded in the concave portion of the first insulating layer 102. The electric fuse 200 is an electric fuse (E fuse) in which the conductive member 206 is cut by applying a current between the first terminal 202 and the second terminal 204.

FIG. 4A shows a configuration of the electric fuse 200 before cutting. FIG. 4B shows a configuration of the electric fuse 200 after cutting. As shown in FIG. 4B, the conductive member 206 has a flowing-out region 212 in which a material forming the conductive member 206 (hereinafter, it is called a fuse forming material) flows out to the outside of the concave portion, and a cut part 214 at which the electric fuse 200 has been cut is formed at a location different from the flowing-out region 212.

Figure 5:
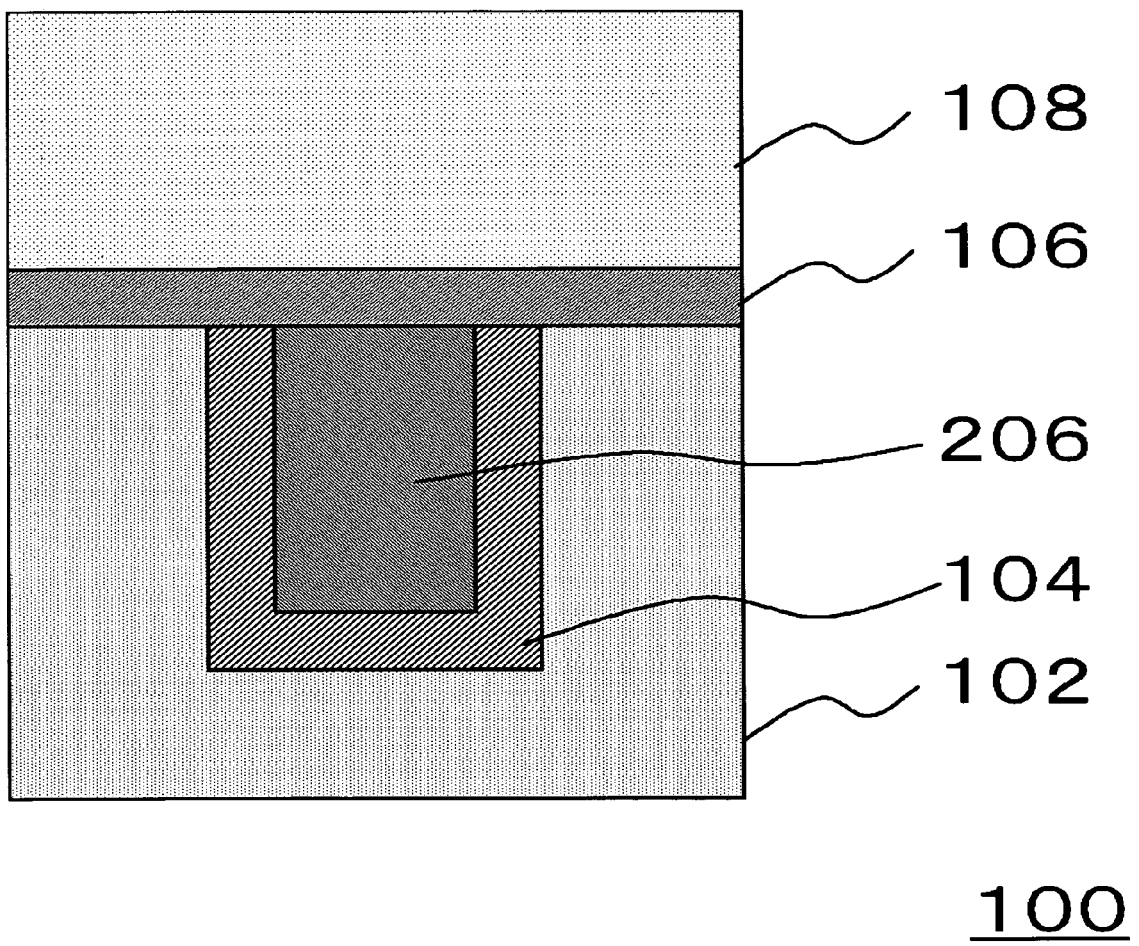
FIG. 5 is a sectional view taken along the A-A' line in FIG. 4A.

FIG. 5 is a cross-sectional view taken along the A-A' line in FIG. 4A.

The semiconductor device 100 further includes on the first insulating layer 102: a first coating layer 106 formed on the conductive member 206; a second coating layer 104 formed on the side surface and the bottom surface of the concave portion formed on the first insulating layer 102; and a second insulating layer 108 formed on the first coating layer 106. The conductive member 206 is formed on the second coating layer 104 in the concave portion formed on the first insulating layer 102. The surface of the conductive member 206 has a configuration in which a part of the regions is covered with the first coating layer 106, and, at the same time, other regions are covered with the second coating layer 104 in the cross section in the stacking direction of the semiconductor substrate.

The first insulating layer 102 may be any levels of insulating layers provided on the semiconductor substrate, for example an element-isolation insulating layer, any insulating interlayer with a multilayered interconnect structure, an insulating layer formed at the bottom of a trench, and the like.

The conductive member 206 may be configured to be a copper containing metal film including copper as a main or principal constituent. The copper containing metal film may include silver. Furthermore, the copper containing metal film may be configured to include one or more different types of elements selected from Al, Au, Pt, Cr, Mo, W, Mg, Be, Zn, Pd, Cd, Hg, Si, Zr, Ti, or, Sn. The copper containing metal film may be formed, using, for example, a plating method. Moreover, for example, a silicide film may be configured to be formed on the surface of the conductive member 206.

The first coating layer 106 is formed with a material different from that of the second coating layer 104. The material of the first coating layer 106 may be configured to be different from that of the second coating layer 104 in, for example, viscosity and/or young's modulus. The second coating layer 104 may be formed with a barrier metal film such as Ta, TaN, Ti, TiN, W, or WN. The barrier metal film may be formed according to a sputtering method, a chemical-vapor deposition (CVD) method, and the like. The first coating layer 106 may be formed with a barrier insulating film such as SiCN, SiN, SiC, SiOF, or SiON. The barrier insulating film may be formed according to the CVD method. The first coating layer 106 may be formed with a material which causes a crack when a current is applied to the electric fuse 200.

The first coating layer 106 may be formed with a material softer than that of the second coating layer 104. Here, a soft material represents, for example, a material with low young's modulus and a low viscosity. The first coating layer 106 may be formed with, for example, a material having a lower young's modulus than that of the material in the second coating layer 104. The layer thickness of the first coating layer 106 may be configured to be, for example, 10 nm to 100 nm. Moreover, the layer thickness of the second coating layer 104 may be also configured to be, for example, 10 nm to 100 nm.

The first insulating layer 102 and the second insulating layer 108 may be also formed with, for example, an $SiO_2$ film, or a low dielectric film such as an SiOC film. Besides SiOC, polyhydrogensiloxane such as hydrogen silsesquioxane (HSQ) methyl silsesquioxane (MSQ), and methylated hydrogen silsesquioxane (MHSQ); aromatic organic material such as polyarylether (PAE), divinyl siloxane-bis-benzocyclobutene (BCB), and Silk (registered trademark); spin on glass (SOG), flowable oxide (FOX), Cytop, and benzocyclobutene (BCB) may be used as a low dielectric film. Moreover, a porous film thereof may be used as the low dielectric film. The material of the first insulating layer 102 and that of the second insulating layer 108 may be configured to be either the same, or different from each other.

The second insulating layer 108 is configured to be formed with a material softer than that of the second coating layer 104. The second insulating layer 108 may be formed with, for example, a material having a lower young's modulus than that of the material in the second coating layer 104. Moreover, the second insulating layer 108 may be formed with a material softer than that of the first coating layer 106. Moreover, the first insulating layer 102 may be formed with a layer softer than the second coating layer 104 and the first coating layer 106.

As one example, there may be considered a configuration in which the first insulating layer 102 is formed with an $SiO_2$ film or an SIOC film (with a young's modulus of about 12 GPa); the second coating layer 104 is formed with a TiN film (with a young's modulus of about 180 GPa); the first coating layer 106 is formed with an SiCN film (with a young's modulus of about 100 GPa; and the second insulating layer 108 is formed with an SiOC film (with a young's modulus of about 12 GPa or less).

Figure 6A:
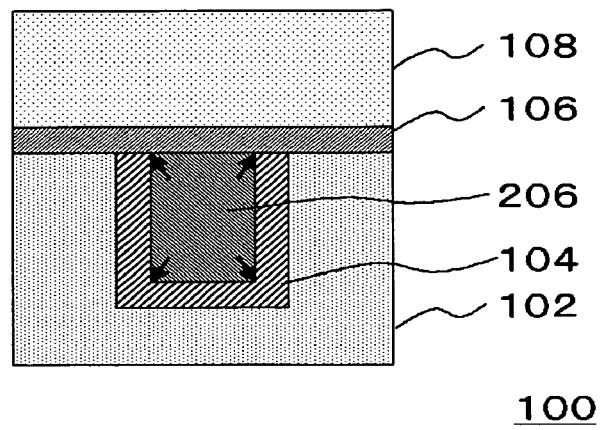
FIGS. 6A to 6D are cross-sectional views which explain a cutting mechanism.
Figure 6B:
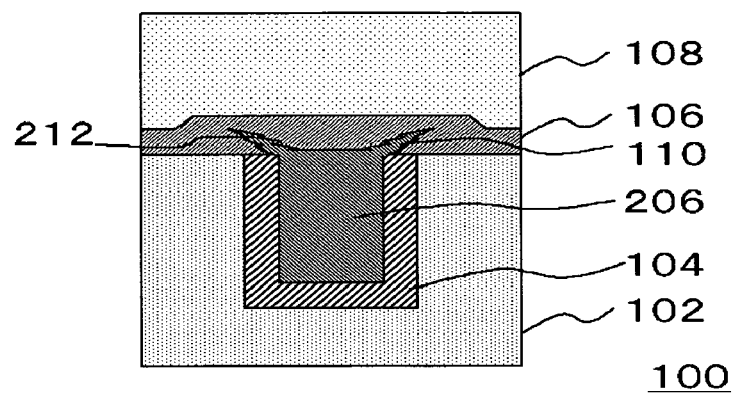
Figure 6C:
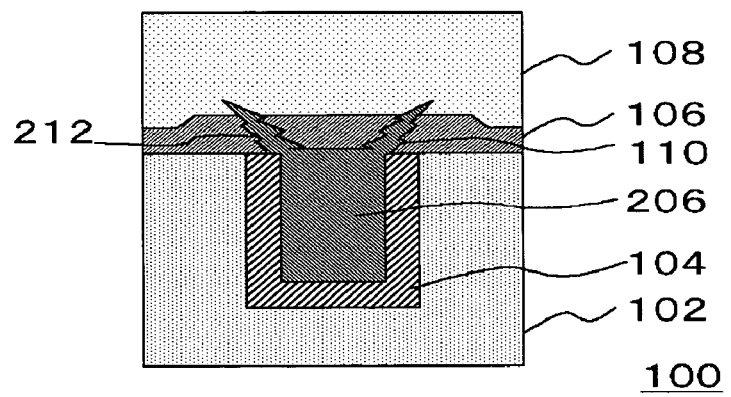
Figure 6D:
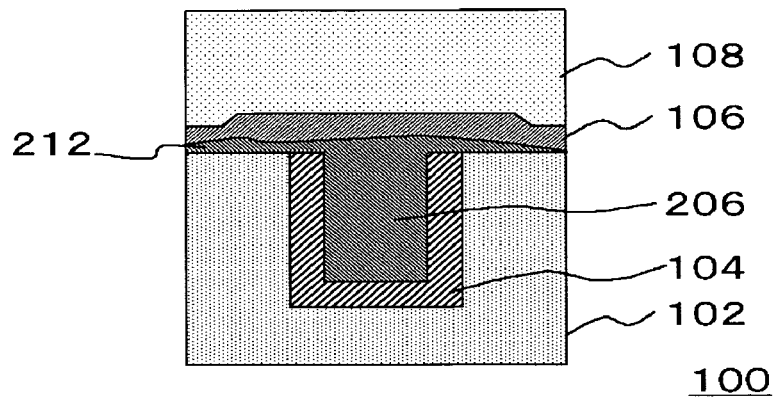
Figure 7A:
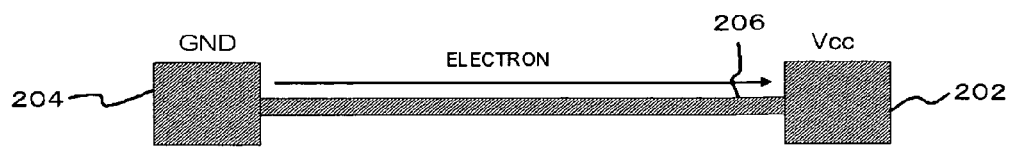
FIGS. 7A to 7C are schematic views of a mechanism by which a conductive member is cut.
Figure 7B:
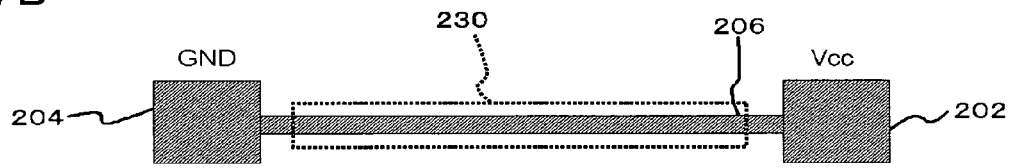
Figure 7C:
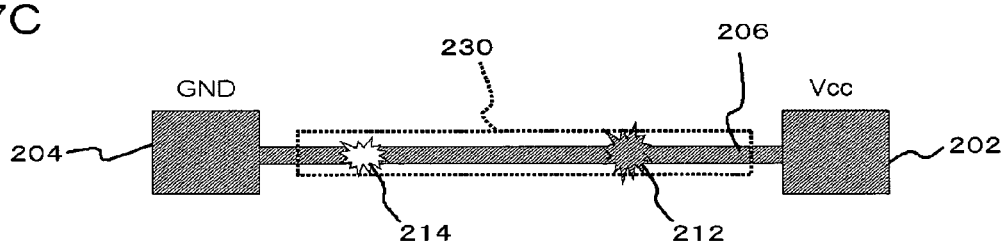

FIG. 6A is a sectional view taken along the A-A' line in FIG. 4A. FIGS. 6B to 6D are sectional views taken along the B-B' line in FIG. 4B. FIGS. 7A to 7C are schematic views of the electric fuse 200. Hereinafter, explanation will be made, further with reference to FIGS. 4A and 4B.

When $V_{cc}$ is applied to the first terminal 202, and the second terminal 204 is grounded, a current flows in the direction from the first terminal 202 to the second terminal 204. At this time, electrons move in the direction from the second terminal 204 to the first terminal 202. When a current exceeding a predetermined current value flows between the first terminal 202 and the second terminal 204, the fuse forming material is heated to cause thermal expansion (FIG. 6A and FIG. 7A).

As a result, a force caused by the fuse forming material, which has thermally expanded, is applied to the first coating layer 106 which is the soft layer, among the coating layers coating the conductive member 206, to generate a crack 110 in the first coating layer 106 (FIG. 6B). At this time, cracks may be generated all around the surrounding of the conductive member 206 (crack generated portion 230 in FIG. 7B).

When the fuse forming material is further heated, the fuse forming material flows into a large crack among cracks formed in the crack generated portion 230. Thereby, the flowing-out region 212 is formed. As the fuse forming material rapidly moves in the direction to the flowing-out region 212 at this time, the conductive member 206 is cut at a location at which the flowing-in material forming the fuse can not catch up with the flowing-out one. According to the above-described mechanism, the cut part 214 is formed at a location away from the flowing-out region 212 to some extent (FIG. 7C).

FIG. 6C is a view showing a cross-sectional structure in which a crack 110 is also generated in the second insulating layer 108. In this case as well, the fuse forming material flows into the crack 110, and the flowing-out region 212 and the cut part 214 are formed.

In some cases, the first coating layer 106 peels off from the first insulating layer 102, and a crevice is generated between the first insulating layer 102 and the first coating layer 106 as shown in FIG. 6D, because a force is applied in direction to the first coating layer 106 by the fuse forming material, which has been thermally expanded. In this case, the fuse forming material flows into the crevice, and the flowing-out region 212 and the cut part 214 are formed as shown in FIG. 7A. FIG. 6B, FIG. 6C, and FIG. 6D, which have been explained above, correspond to the sectional view taken along the B-B' line in FIG. 4B.

Figure 8A:
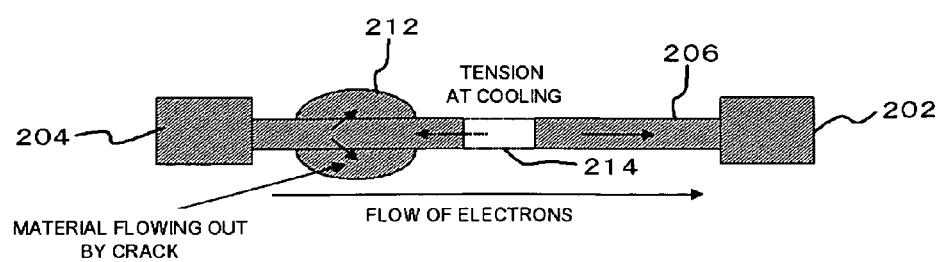
FIGS. 8A to 8C are views showing movement of a material forming the conductive member after the conductive member is cut.
Figure 8B:
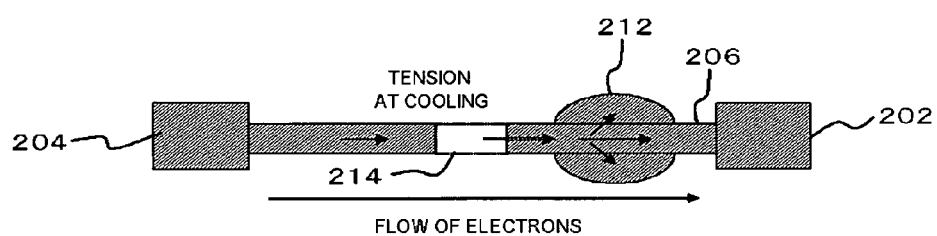
Figure 8C:
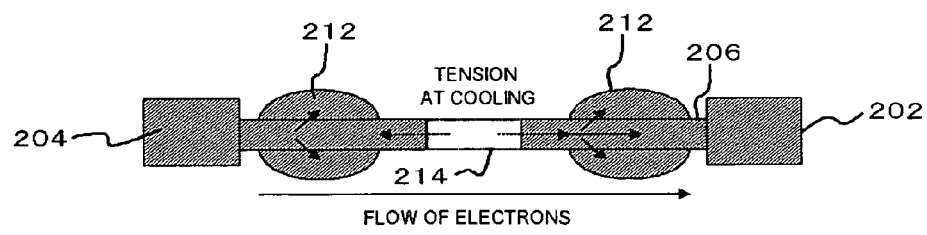

FIGS. 8A to 8C is views showing a moving state of the fuse forming material after the cut part 214 is generated in the conductive member 206.

When the cut part 214 is generated in the conductive member 206, a current does not flow in the conductive member 206, and the conductive member 206 is gradually cooled. At this time, for example, when the flowing-out region 212 is formed at a location nearer the second terminal 204 and away from the cut part 214 as shown in FIG. 8A, tension in the direction from the cut part 214 to the flowing-out region 212 is applied at cooling to between the flowing-out region 212 and the cut part 214, and the material forming the conductive member 206 moves in the direction to the flowing-out region 212. Moreover, the material moves in the direction to the first terminal 202 between the cut part 214 and the first terminal 202 under the influence of electron movement during current application to between the first terminal 202 and the second terminal 204. Thereby, the moving directions of the materials are opposite to each other on both sides of the cut part 214, and the sufficiently large cut part 214 can be formed.

Moreover, for example, when the flowing-out region 212 is formed at a location nearer the first terminal 202 and away from the cut part 214 as shown in FIG. 8B, tension in the direction from the cut part 214 to the flowing-out region 212 is applied at cooling to between the cut part 214 and the flowing-out region 212, and the material forming the conductive member 206 moves in the direction to the flowing-out region 212. At this time, the material moves in the direction to the cut part 214 between the cut part 214 and the second terminal 204 under the influence of electron movement during current application to between the first terminal 202 and the second terminal 204. However, the moving amount of the material forming the conductive member 206 in the direction to the cut part 214 is very small, as compared to that of the material forming the conductive member 206 in the direction to the flowing-out region 212. Moreover, as the large amount of the material forming the conductive member 206 flows into the flowing-out region 212 at cutting the conductive member 206, the large cut part 214 can be formed. Thereby, the sufficiently large cut part 214 can be kept.

Moreover, for example, when the flowing-out regions 212 are formed at two locations between the cut part 214 and the first terminal 202, and the cut part 214 and the second terminal 204 as shown in FIG. 8C, pieces of tension are applied at cooling in the directions to the two flowing-out regions 212, and the material forming the conductive member 206 moves in the direction to the two flowing-out regions 212. Thereby, the moving directions of the materials are opposite to from each other on both sides of the cut part 214, and the sufficiently large cut part 214 can be formed.

As described above, the electric fuse 200 can be reliably cut, and, at the same time, a cut state can be preferably held according to the crack assist type cutting.

In addition, the present inventor has found that there are generated the following problems when an electric fuse with a plurality of folded structures is cut according to the crack assist type cutting, wherein the structure has been described in Japanese Laid-open patent publication No. 2005-39220 and the like.

Figure 20:
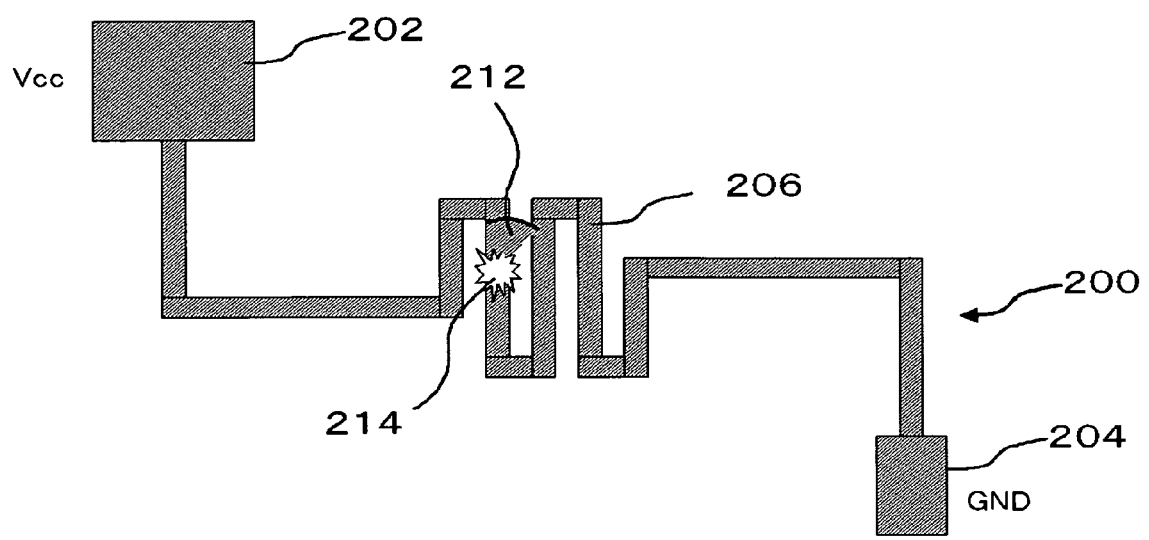
FIG. 20 is a plan view showing a short circuit between adjacent interconnects in the electric fuse with a folded structure.
Figure 21:
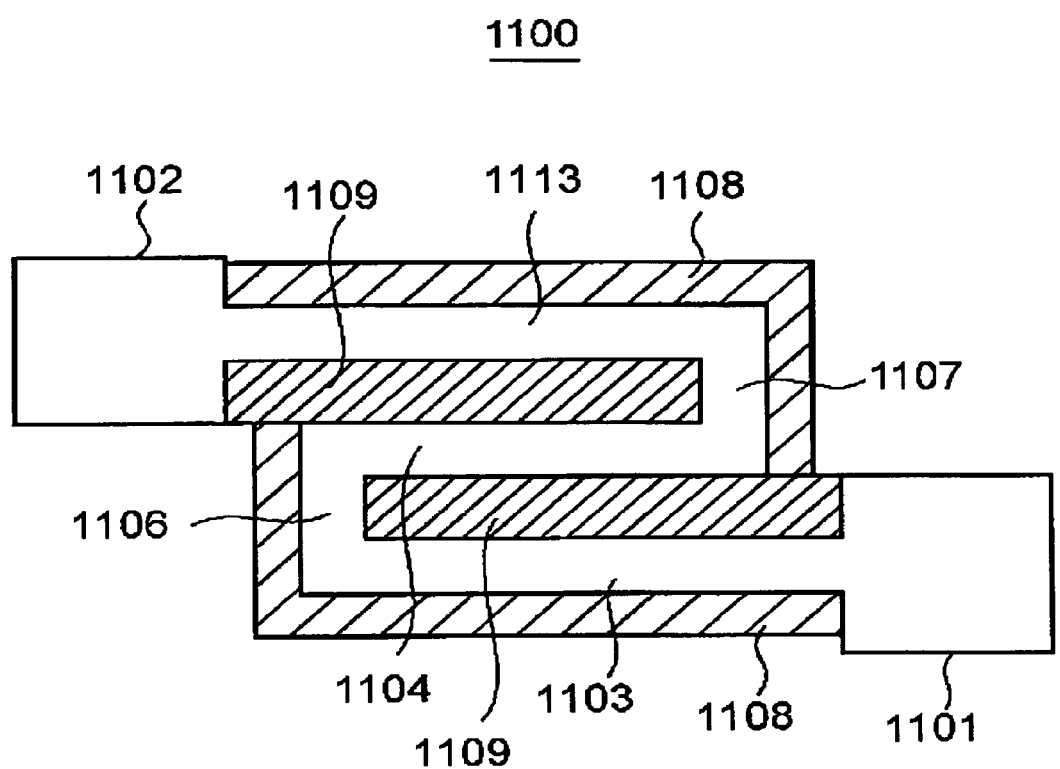
FIG. 21 is a top view showing one example of a conventional current fuse.

FIG. 20 is a plan view showing an electric fuse with a similar structure, in which a conductive member is folded up a plurality of times, to the structure described in Japanese Laid-open patent publication No. 2005-39220 and the like. An electric fuse 200 has a conductive member 206, a first terminal 202 provided at one end, and a second terminal 204 provided at the other end thereof. Here, the electric fuse 200 is configured to easily be cut according to the crack assist type cutting. That is, the electric fuse 200 may be configured to be included in a similar semiconductor device 100 to the semiconductor device which has been explained, with reference to FIG. 5.

When a predetermined voltage is applied to between the first terminal 202 and the second terminal 204 in the electric fuse 200 with the above-described configuration, a current flows in the direction from the first terminal 202 to the second terminal 204. At this time, a plurality of straight line portions are juxtaposed in substantially parallel with one another in the folded portion of the conductive member 206. Heat from other straight line portions flows into a straight line portion enclosed with the other straight line portions to keep the central part at a comparatively high temperature. As the fuse forming material easily expands in portions with a high temperature in the conductive member 206, a crack and the like are generated therein for flowing-out of the fuse forming material. At this time, the conductive member 206 is cut at a location at which the flowing-in material forming the fuse has not caught up with the flowing-out one to form a cut part 214. However, as a straight line potion in the central part is adjacent to other straight line portions in the electric fuse 200 with the above-described configuration, a flowing-out region 212 extends even to the adjacent other straight line portions in some cases to cause conducting among the adjacent straight line portions to one another. When the cut part 214 is formed between the flowing-out region 212 and the conducted portion as shown in the drawing, there is caused a state in which the conductive member 206 is electrically connected.

The present inventor has developed an electric fuse 200 with a configuration in which a crack and the like are easily generated, and cutting is very probably caused, especially, when the electric fuse 200 is cut by the crack assist type cutting, and, at the same time, there are not caused the above-described problems. Hereinafter, the above configuration will be explained.

FIRST EMBODIMENT

FIG. 1 is a plan view showing the configuration of an electric fuse included in a semiconductor device according to the present embodiment.

An electric fuse 200 includes: a conductive member 206 formed with a wide interconnect 207 (first interconnect), and a narrow interconnect 209 (second interconnect); a first terminal 202 formed at one end; and a second terminal 204 formed at the other end of the conductive member 206. The narrow interconnect 209 is formed as a narrower interconnect width than that of the wide interconnect 207, wherein the interconnect width represents an interconnect width approximately perpendicular to a current direction (hereinafter, simply called "interconnect width"). Moreover, the electric fuse 200 has a juxtaposed region 208 in which a plurality of straight line portions are juxtaposed with each other by folding of the wide interconnect 207. In the present embodiment, the electric fuse 200 is an electric fuse (E fuse) in which the conductive member 206 is cut by applying a current to between the first terminal 202 and the second terminal 204.

The narrow interconnect 209 is connected to the wide interconnect 207 outside the juxtaposed region 208. The narrow interconnect 209 includes: a first narrow straight line portion 209a connected to the first terminal 202; a second narrow straight line portion 209b connected to the first narrow straight line portion 209a; a fourth narrow straight line portion 209d connected to the second terminal 204; and a third narrow straight line portion 209c connected to the fourth narrow straight line portion 209d. The wide interconnect 207 has a configuration in which a separation portion 207a (a third connecting portion), a wide straight line portion 207b, a wide connecting portion 207c, a wide straight line portion 207d, a wide connecting portion 207e, a wide straight line portion 207f, a wide connecting portion 207g, a wide straight line portion 207h, a wide connecting portion 207i, a wide straight line portion 207j, and a separation portion 207k (a third connecting portion) are connected in this order between the second narrow straight line portion 209b and the third narrow straight line portion 209c. In the present embodiment, the wide straight line portion 207b, the wide straight line portion 207d, the wide straight line portion 207f, the wide straight line portion 207h, and the wide straight line portion 207j are arranged approximately in parallel with one another. In the present embodiment, the juxtaposed region 208 has a configuration in which three straight line portions are arranged in parallel with each other by folding the wide interconnect 207 at least two times. Moreover, in the juxtaposed region 208, the wide interconnect 207 is configured to be folded in such a way that a first straight line portion (for example, the wide straight line portion 207b), a second straight line portion (for example, the wide straight line portion 207d), which are arranged approximately in parallel with each other, and a first connecting portion (for example, the wide connecting portion 207c) connecting one end of the first straight line portion and one end of the second straight line portion. Moreover, the wide interconnect 207 further includes a third connecting portion (for example, the separation portion 207a) one end of which is connected to the other end of the first straight line portion, and which extends in the direction approximately perpendicular to the extending direction of the first straight line portion and in the moving-away direction from the second straight line portion. The narrow interconnect 209 is configured to be connected to the other end of the third connecting portion.

Hereinafter, the direction from the first terminal 202 to the second terminal 204 is called the traveling direction. The conductive member 206 bends about ninety degrees to the left side in the traveling direction at a connecting location of the first narrow straight line portion 209a and the second narrow straight line portion 209b. The second narrow straight line portion 209b and the separation portion 207a are formed on the same straight line. The conductive member 206 bends about ninety degrees to the left side in the traveling direction at a connecting location of the separation portion 207a and the wide straight line portion 207b. Furthermore, the conductive member 206 bends about ninety degrees to the right side in the traveling direction at a connecting location of the wide straight line portion 207b and the wide connecting portion 207c, and bends again about ninety degrees to the right side in the traveling direction at a connecting location of the wide connecting portion 207c and the wide straight line portion 207d. Similarly, the conductive member 206 bends about ninety degrees to the left side in the traveling direction at a connecting location of the wide straight line portion 207d and the wide connecting portion 207e, and, then, at a connecting location of the wide connecting portion 207e and the wide straight line portion 207f again. Furthermore, the conductive member 206 bends about ninety degrees to the right side in the traveling direction at a connecting location of the wide straight line portion 207f and the wide connecting portion 207g, and, then, at a connecting location of the wide connecting portion 207g and the wide straight line portion 207h again. The conductive member 206 bends about ninety degrees to the left side in the traveling direction at a connecting location of the wide straight line portion 207h and the wide connecting portion 207i, and, then, at a connecting location of the wide connecting portion 207i and the wide straight line portion 207j again. Furthermore, the conductive member 206 bends about ninety degrees to the right side in the traveling direction at a connecting location of the wide straight line portion 207j and the separation portion 207k, and, then, at a connecting location of the third narrow straight line portion 209c and the fourth narrow straight line portion 209d again. In accordance therewith, the wide interconnect 207 is folded a plurality of times into a meandering shape in the juxtaposed region 208. Here, "folding" represents a location at which the conductive member 206 is folded at an angle larger than ninety degrees. In the configuration shown in FIG. 1, the wide interconnect 207 is folded four times.

Figure 2A:
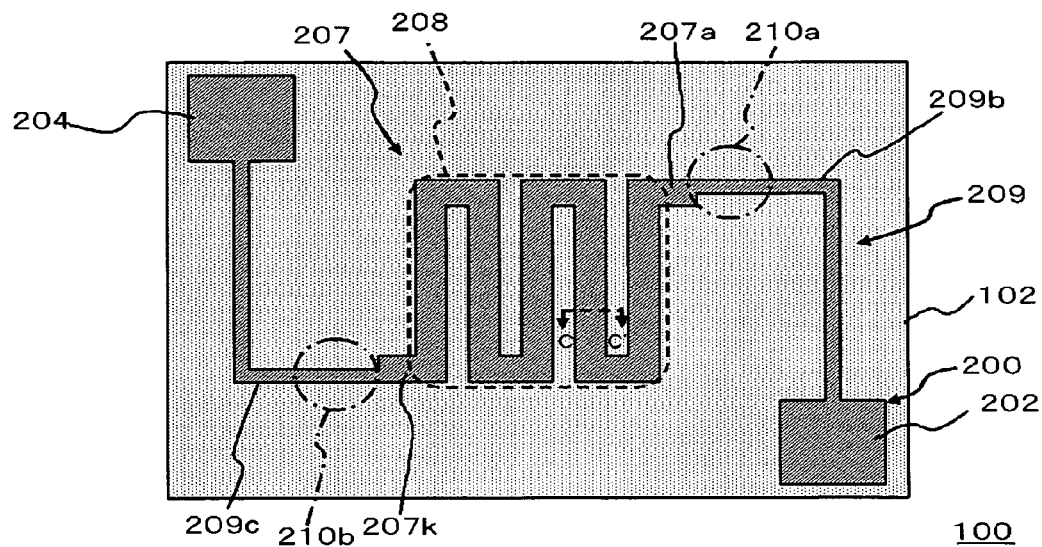
FIGS. 2A and 2B are plan views showing a configuration of the semiconductor device according to the embodiment of the present invention.
Figure 2B:
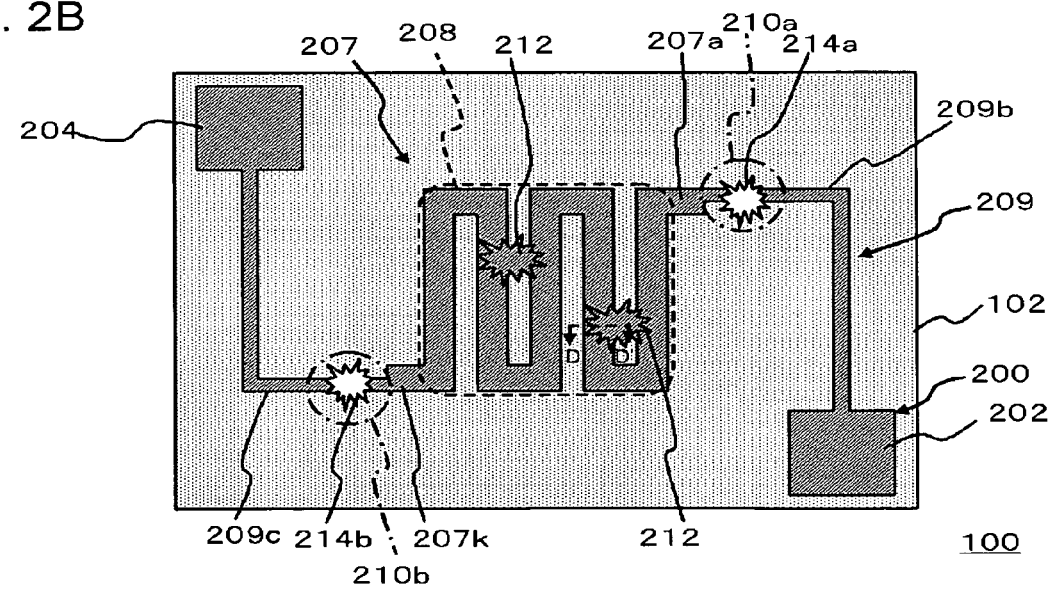

FIGS. 2A and 2B are plan views showing a configuration of the semiconductor device, shown in FIG. 1, including the electric fuse 200. FIG. 2A shows the configuration of the semiconductor device 100 including the electric fuse 200 before cutting. FIG. 2B shows the configuration of the semiconductor device 100 including the electric fuse 200 after cutting.

The semiconductor device 100 includes: a semiconductor substrate (not shown); and a first insulating layer 102 which is formed thereon and on which concave portion is formed. The electric fuse 200 is formed on the first insulating layer 102, and the conductive member 206 is formed in such a way that the concave portion of the first insulating layer 102 is embedded therewith.

In the present embodiment, the semiconductor device 100 has a similar configuration to that of the device which has been explained, with reference to FIG. 5, though only the shape of the electric fuse 200 is different from each other. FIG. 5 corresponds to the cross-sectional view taken along the C-C' line in FIG. 2A. Moreover, FIGS. 6B to 6D correspond to the cross-sectional view taken along the D-D' line in FIG. 2B. The first coating layer 106 is formed at least on the wide interconnect 207. Moreover, the wide interconnect 207 and the narrow interconnect 209 are formed in such a way that the concave portion of the first insulating layer 102 is embedded therewith. Furthermore, at least the wide interconnect 207 is formed on the second coating layer 104 in the concave portion. Here, the first coating layer 106 and the second coating layer 104 may be configured to be formed on the whole surface of the semiconductor substrate.

In the present embodiment, the wide interconnect 207 is folded into a plurality of straight line portions in the juxtaposed region 208. The both sides of, for example, the wide straight line portion 207d, the wide straight line portion 207f, the wide straight line portion 207h and the like are formed to be enclosed with other straight line portions of the wide interconnect 207. Moreover, the wide straight line portion 207b and the wide straight line portion 207j are also adjacent with other straight line portions of the wide interconnect 207. In the present embodiment, the conductive member 206 is kept at a comparatively high temperature in the juxtaposed region 208 when a current flows in the conductive member 206 because the juxtaposed region 208 has a structure in which the wide interconnect 207 is folded for several times is formed. Accordingly, the material forming the electric fuse 200 according to the present embodiment is the easiest to be expanded in the juxtaposed region 208. Therefore, cracks and the like are generated in the juxtaposed region 208, and the expanded fuse forming material easily flows into the cracks. When the fuse forming material flows out to the outside in the juxtaposed region 208, the fuse forming material moves in the outside direction. As the interconnect width of the wide inter connect 207 is formed wide in the present embodiment, the wide interconnect 207 is prevented from being cut. On the other hand, the narrow interconnect 209 is easily cut because the inter connect width is formed narrow. Especially, cutting is easily caused in the second narrow straight line portion 209b and/or the third narrow straight line portion 209c, which are connected directly to the wide interconnect 207.

Accordingly, in the present embodiment, the juxtaposed region 208 becomes an expected flowing-out region in which the fuse forming material flows out to the outside of the concave portion when a current exceeding a predetermined current value is applied to between the first terminal 202 and the second terminal 204. Moreover, an expected cut region 210a is provided on the second narrow straight line portion 209b, and an expected cut region 210b is provided on the third narrow straight line portion 209c in the electric fuse 200, wherein the fuse forming material flows out from the juxtaposed region 208, and the fuse forming material in the concave portion rapidly moves in the direction to the juxtaposed region 208 to cut the expected cut regions. Here, the expected region represents a region in which there is a high possibility that flowing out is caused, or a high possibility that cutting is caused, but flowing out or cutting is not always caused in the expected region.

The width of the wide interconnect 207 is required to be formed wide some extent in order to prevent cutting of the wide interconnect 207. From the above viewpoint, the width of the wide interconnect 207 may be made about 1.25 times or more as that of the narrow interconnect 209. On the other hand,: heat in the folded portion is reduced, and an effect of selective flowing-out is reduced in the folded portion of the wide interconnect 207 when the width of the wide interconnect 207 is too wide. From such a viewpoint, the width of the wide interconnect 207 may be configured to be about two times or less that of the narrow interconnect 209. The width of the wide interconnect 207 may be configured to be, for example, 0.16 μm. The width of the narrow interconnect 209 may be configured to be, for example, 0.12 μm. The width of the narrow interconnect 209 may be configured to be 80% or less as of that of the wide interconnect 207. Thereby, even if the fuse forming material flows out to the outside, it may be configured in the wide interconnect 207 that cutting is not caused at the wide interconnect 207 and is caused at the narrow interconnect 209.

Moreover, the separation portion 207a and the separation portion 207k separate the narrow interconnect 209 from the juxtaposed region 208. The fuse forming material which has flown out in the juxtaposed region 208 may be prevented from reaching the cut part by providing the above separation portions 207a and 207k. Though the drawing shows a schematic view (hereinafter, the same with other drawings), the width $D_1$ of the separation portion 207a and that of the separation portion 207k may be configured to be about three times or more as that of the wide interconnect 207.

According to the above-described configuration, the cut part 214a and the cut part 214b may be formed at a location away from the juxtaposed region 208. Accordingly, even when the flowing-out region 212 is formed across between the adjacent straight line portions in the juxtaposed region 208, the electric fuse 200 can be surely cut.

Subsequently, the mechanism in which the electric fuse 200 is cut by the crack assist type cutting in the semiconductor device 100 in the present embodiment will be explained.

When $V_{cc}$ is applied to the first terminal 202, and the second terminal 204 is grounded, a current flows from the first terminal 202 to the second terminal 204. At this time, electrons move in the direction from the second terminal 204 to the first terminal 202. The fuse forming material is heated, and is thermally expanded by the current flowing between the first terminal 202 and the second terminal 204. In the present embodiment, the fuse forming material is easily heated and thermally expanded in the juxtaposed region 208 in comparison with other regions. Therefore, a large crack may be generated in the juxtaposed region 208. When the fuse forming material is further heated and is expanded, the fuse forming material flows into a location in which the large crack is generated. As a result, the flowing-out region 212 is formed in the juxtaposed region 208 as shown in FIG. 2B.

Moreover, as the separation portion 207a is formed between the juxtaposed region 208 and the second narrow straight line portion 209b, and the separation portion 207k is formed between the juxtaposed region 208 and the third narrow straight line portion 209c, the cut part may be generated at a location away from the juxtaposed region 208. The large cut part 214 is formed at a location away from the flowing-out region 212 to some extent by the above-described mechanism.

Figure 3A:
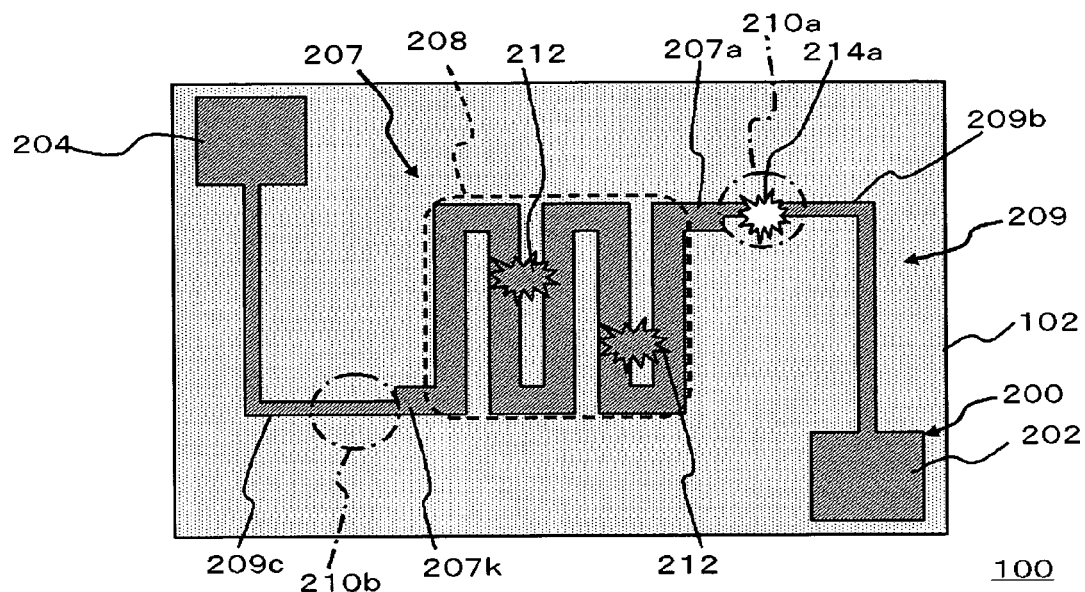
FIGS. 3A and 3B are plan views showing another example of the configuration of the semiconductor device according to the embodiment of the present invention.
Figure 3B:
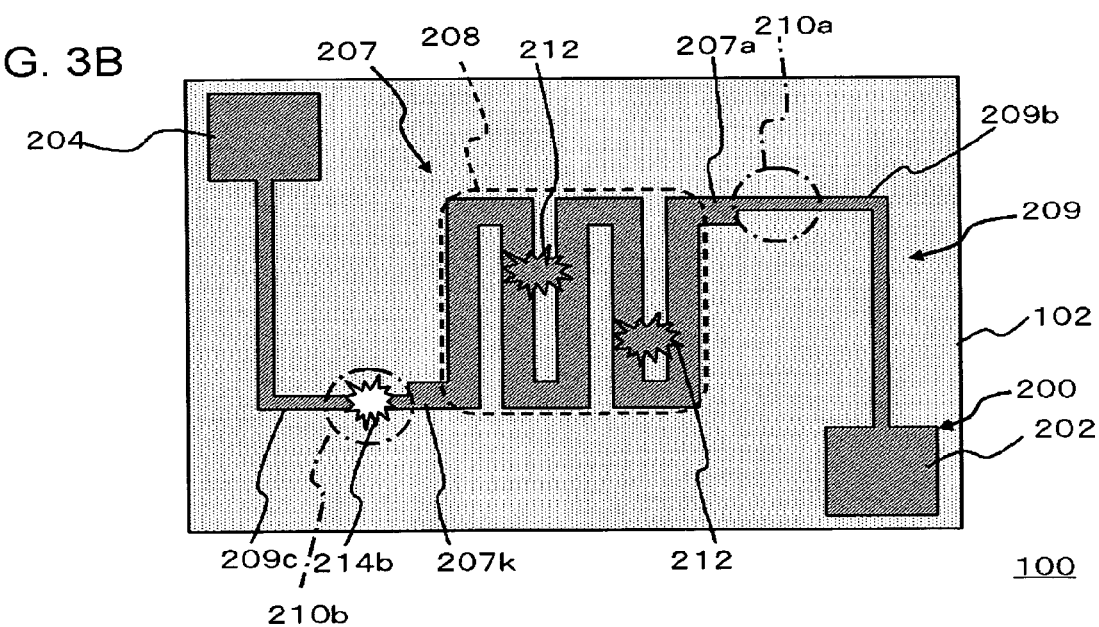

Though there has been shown a configuration, as shown in FIG. 2B, in which the cut part 214a is provided at the second narrow straight line portion 209b, and, at the same time, the cut part 214b is provided at the third narrow straight line portion 209c, there may be a configuration in which the cut part is generated only at the second narrow straight line portion 209b, or the third narrow straight line portion 209c as shown in FIGS. 3A and 3B. Furthermore, the cut part may be formed at a location excluding the ones shown above, for example, on the first narrow straight line portion 209a, or on the fourth narrow straight line portion 209d. Moreover, though an example in which the first narrow straight line portion 209a and the fourth narrow straight line portion 209d are formed with the narrow interconnect 209 has been shown in the present embodiment, the above portions may be formed with the wide interconnect 207.

(Voltage Application to Electric Fuse)

In the present embodiment, the flowing-out region 212 is formed in the conductive member 206 by applying excessive power to the electric fuse 200, and, at the same time, the cut part 214 is generated as described above. In the present embodiment, for example, a voltage of about 2 volts to about 5 volts is applied to between the first terminal 202 and the second terminal 204. Thereby, in the semiconductor device 100 with the above-described configuration, the flowing-out region 212 and the cut part 214 may be formed in the electric fuse 200.

Figure 9:
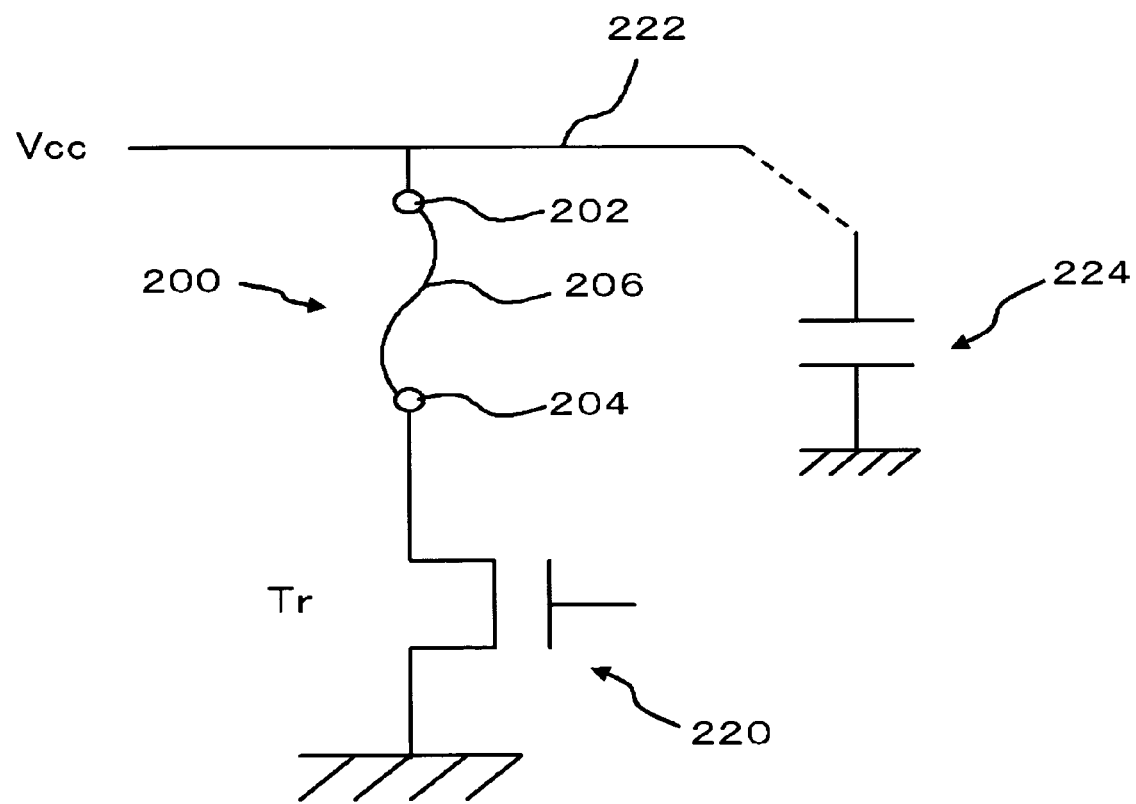
FIG. 9 is a view showing a configuration of a circuit including an electric fuse of the semiconductor device in the embodiment of the present invention.

FIG. 9 is a view showing a circuit configuration including the electric fuse 200 in the semiconductor device 100.

The first terminal 202 in the electric fuse 200 is connected to a power supply line 222, and the second terminal 204 is connected to one of the source and the drain in the transistor 220. The other of the source and the drain of the transistor 220 is grounded. Moreover, the semiconductor device 100 has a plurality of electric fuses 200, and the plurality of electric fuses 200 are connected to the power supply line 222, which has not been shown. Therefore, there is caused a state in which stray capacitance 224 is added to the power supply line 222. A procedure by which the electric fuse 200 is cut in the circuit with the above-described configuration will be explained.

In the present embodiment, when the power supply line 222, and the transistor 220 are activated, the power supply voltage $V_{CC}$ is applied to the first terminal 202, and the second terminal 204 is grounded, and a current flows in the conductive member 206. As a result, there is caused a cut part in the conductive member 206. Here, there may be a configuration in which, when a voltage is applied to the electric fuse 200, the transistor 220 is activated after the power supply line 222 is activated.

Figure 10:
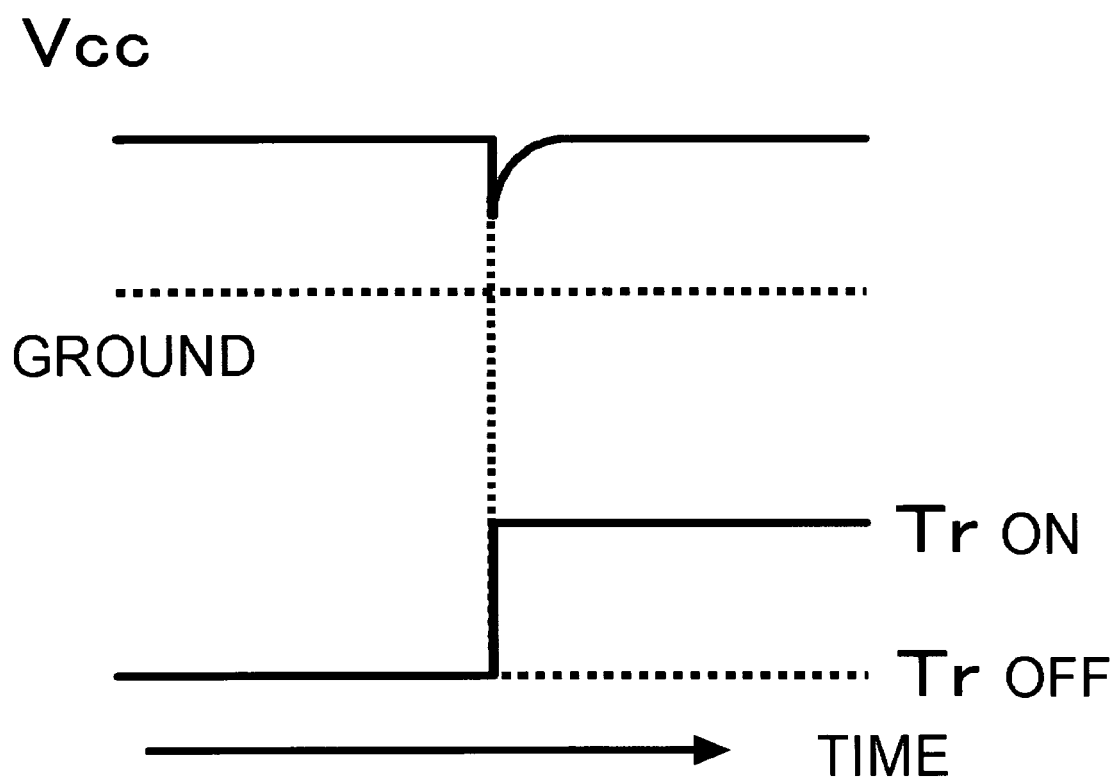
FIG. 10 is a view showing activating timing of a transistor, and voltage values applied to the first terminal in the electric fuse.

FIG. 10 is a view showing activating timing of the transistor, and voltage values applied to between the first terminal and the second terminal in the electric fuse.

When the transistor 220 is activated after the power supply line 222 is activated, instant voltage drop is generated by timing when the transistor 220 is activated, but the voltage value becomes $V_{CC}$ just after the drop. As a result, excessive power will be applied to the electric fuse 200 at a point when the transistor 220 is activated. Thereby, the conductive member 206 flows out to the outside of the concave portion in the first insulating layer 102 to form the flowing-out region 212, and, at the same time, the large cut part 214 may be formed.

Figure 11:
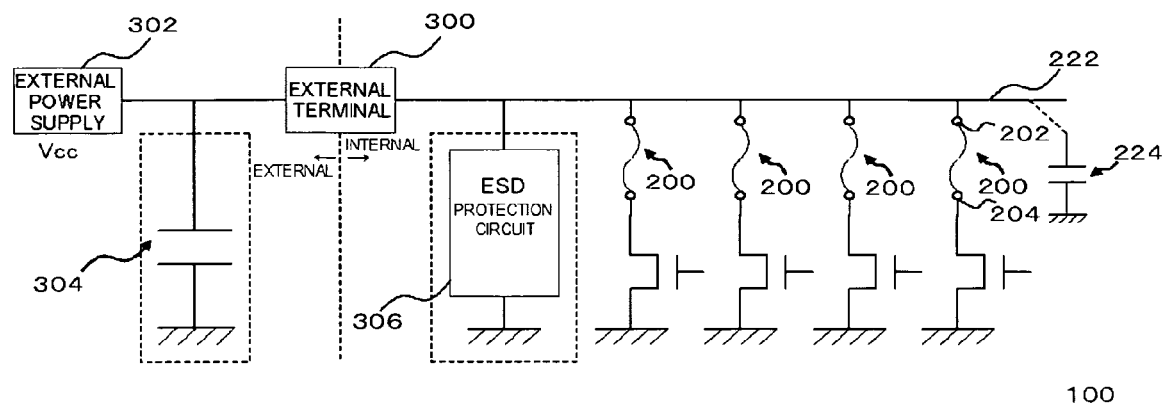
FIG. 11 is a view showing one example of the configuration of the semiconductor device according to the embodiment of the present invention.

FIG. 11 is a view showing another example of a circuit configuration including the electric fuse 200 in the semiconductor device 100.

Here, a first terminal 202 may be connected to a circuit having a sufficiently larger capacity than a charge amount reduced by cutting the electric fuse 200. A power supply line 222 is connected to an external power supply 302 through an external terminal 300. Furthermore, the power supply line 222 is connected to a circuit with a sufficiently large capacity such as an external capacitor 304 and an electrostatic discharge (ESD) protection circuit 306. The external capacitor 304 may be configured to be provided outside a chip such as a probe card. The power supply line 222 may be configured to be connected to both of the external capacitor 304 and the ESD protection circuit 306, or to be connected to either of them.

Here, it is assumed that, for example, the capacity of the stray capacitance 224 is $C_o$, and the capacity of either of the external capacitor 304 and the ESD protection circuit 306, which is connected to the power supply line 222, is $C_1$. Moreover, when it is assumed that a value of a voltage supplied from the external power supply 302 is $V_{cc}$, an amount of charges Q accumulated in the semiconductor device 100 before cutting the electric fuse 200 is expressed as follows:

$$Q=(C_o+C_1)V_{cc}$$

When it is assumed that a current which flows at cutting of the electric fuse 200 is $I_{cut}$, and time for cutting the electric fuse 200 is $T_{cut}$, the amount of reduced charges which are reduced by cutting the electric fuse 200 is expressed as follows:

$$\Delta Q=I_{cut}\times T_{cut}$$

In the present embodiment, $C_o$ and $C_1$, may be set in such away that $\Delta Q/Q<0.01$ (Formula 1). Thereby, instant voltage drop which is generated, as shown in FIG. 10, at timing when the transistor 220 is activated may be reduced. Here, when a number of electric fuses 200 are connected to the power supply line 222, and the formula 1 is satisfied only with the capacity $C_o$ of the stray capacitance 224, there may be a configuration in which the external capacitor 304 and the ESD protection circuit 306 are not connected with power supply line 222. Moreover, when the formula 1 is satisfied with the capacity $C_o$, and either of the external capacitor 304 and the ESD protection circuit 306, there may be a configuration in which only either of the external capacitor 304 or the ESD protection circuit 306 is connected to the power supply line 222.

(Variations)

Subsequently, variations of the semiconductor device 100 in the present embodiment will be explained.

Figure 12A:
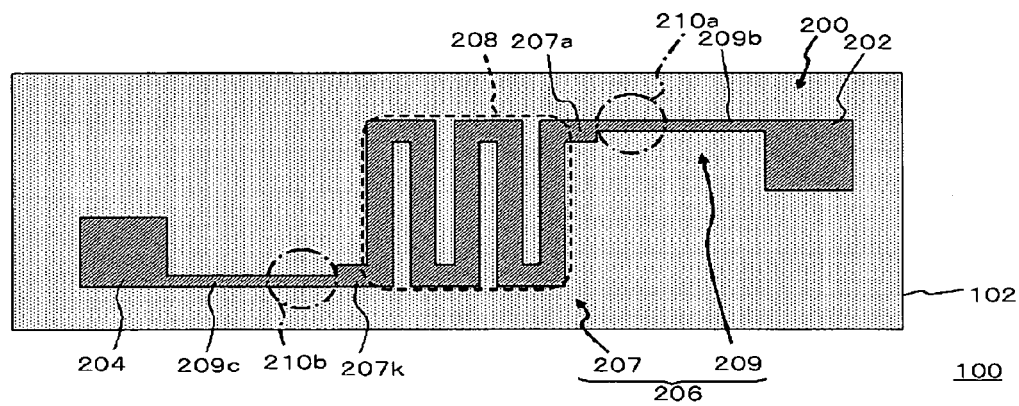
FIGS. 12A and 12B are plan views showing another example of a configuration of the semiconductor device according to the embodiment of the present invention.
Figure 12B:
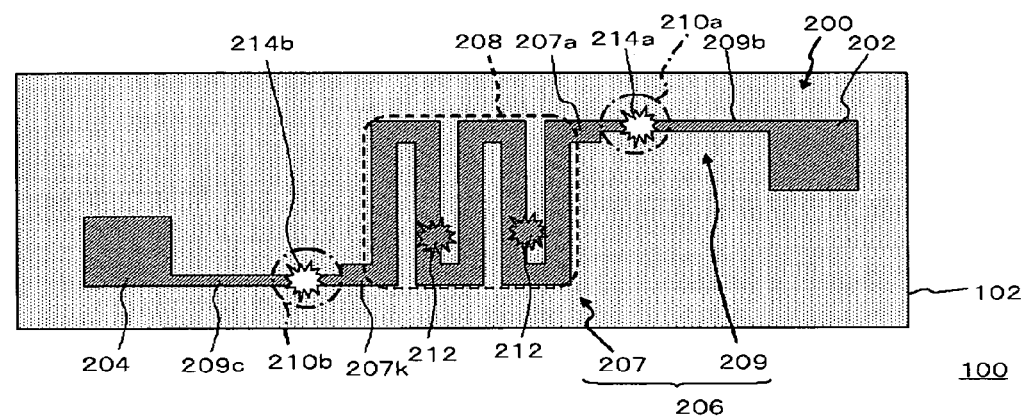

FIGS. 12A and 12B are plan views showing another example of the semiconductor device 100 in the present embodiment. FIG. 12A shows one example of a configuration of the electric fuse 200 before cutting, and FIG. 12B shows one example of the configuration of the electric fuse 200 after cutting.

Here, the above configuration is different from those shown in FIG. 1, FIG. 2A, and FIG. 2B in a point that the electric fuse 200 does not include the first narrow straight line portion 209a and the fourth narrow straight line portion 209d. Even the above configuration may obtain similar effects to those of configurations shown in FIG. 1, FIG. 2A, and FIG. 2B. Moreover, though FIG. 12B shows a configuration in which a cut part 214a is provided on a second narrow straight line portion 209b, and a cut part 214b is provided on a third narrow straight line portion 209c, there may be a configuration in which a cutting location is generated on only either of the second narrow straight line portion 209b or the third narrow straight line portion 209c.

Figure 13A:
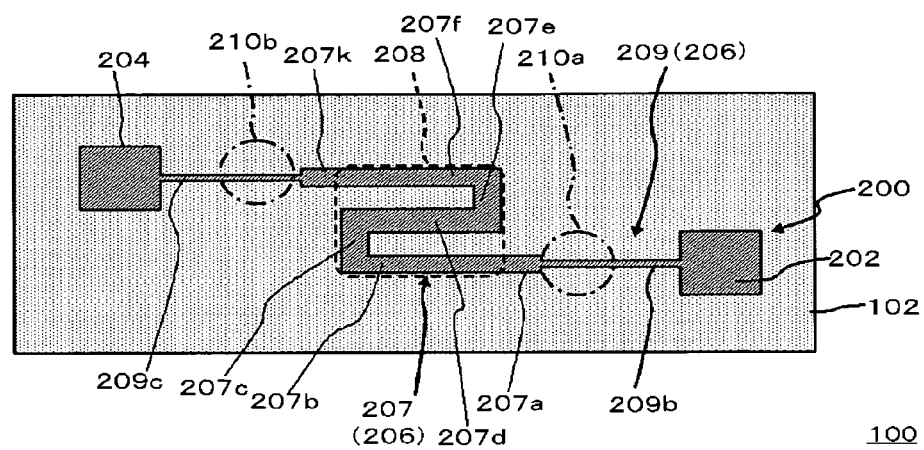
FIGS. 13A and 13B are plan views showing another example of a configuration of the semiconductor device according to the embodiment of the present invention.
Figure 13B:
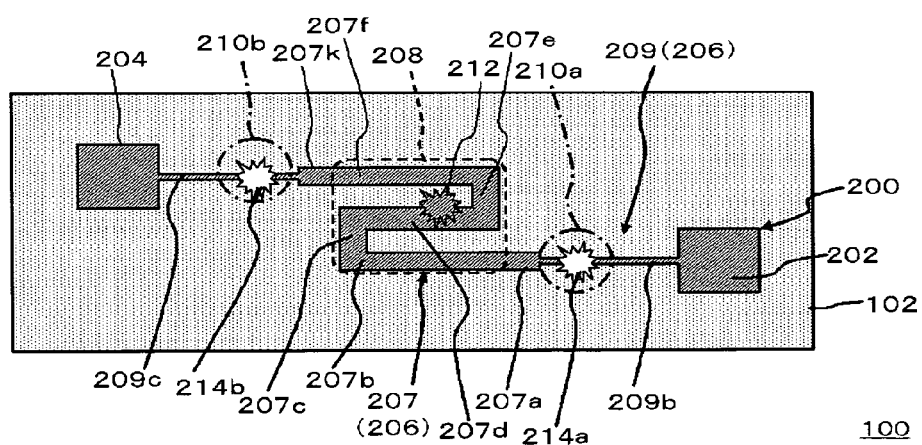

FIGS. 13A and 13B are plan views showing further another example of the semiconductor device 100 in the present embodiment. FIG. 13A shows one example of a configuration of the electric fuse 200 before cutting, and FIG. 13B shows one example of the configuration of the electric fuse 200 after cutting.

Here, the narrow interconnect 209 includes a second narrow straight line portion 209b connected to a first terminal 202, and a third straight line portion 209c connected to a second terminal 204. The wide interconnect 207 has a configuration in which a separation portion 207a (extending portion), a wide straight line portion 207b, a wide connecting portion 207c, a wide straight line portion 207d, a wide connecting portion 207e, a wide straight line portion 207f, and a separation portion 207k (extending portion) are connected in this order between the second narrow straight line portion 209b and the third narrow straight line portion 209c. The wide straight line portion 207b, the separation portion 207a and the second narrow straight line portion 209b are formed in such a way that they extend on the same straight line, and the wide straight line portion 207f, the separation portion 207k, and the third narrow straight line portion 209c are formed in such a way that they extend on the same straight line.

Hereinafter, the traveling direction represents a direction from the first terminal 202 to the second terminal 204. The conductive member 206 is extending in one direction through the second narrow straight line portion 209b, the separation portion 207a, and the wide straight line portion 207b. The conductive member 206 bends about ninety degrees to the right side in the traveling direction at a connecting location of the wide straight line portion 207b and the wide connecting portion 207c, and, then, at a connecting location of the wide connecting portion 207c and the wide straight line portion 207d again. Thereby, the conductive member 206 is folded one time. Similarly, the conductive member 206 bends about ninety degrees to the left side in the traveling direction at a connecting location of the wide straight line portion 207d and the wide connecting portion 207e, and, then, at a connecting location of the wide connecting portion 207e and the wide straight line portion 207f. Thereby, the wide interconnect 207 is folded two times into a meandering shape (inverted S shape) in the juxtaposed region 208. Furthermore, the conductive member 206 is extending in one direction through the wide straight line portion 207f, the separation portion 207k, and the third narrow straight line portion 209c.

Even in the above-described configuration, the wide interconnect 207 is kept at a comparatively high temperature in the juxtaposed region 208, because the wide interconnect 207 has a folded structure, and heat easily gathers into the region 208 when a current is applied to between the first terminal 202 and the second terminal 204. Therefore, the fuse forming material easily flows out in the juxtaposed region 208. Moreover, as the interconnect widths of the second narrow straight line portion 209b and the third narrow straight line portion 209c are formed narrower than that of the wide interconnect 207, a cut part is easily generated in the second narrow straight line portion 209b and the third narrow straight line portion 209c. Furthermore, as the second narrow straight line portion 209b is further separated from the juxtaposed region 208 through the separation portion 207a, and the third narrow straight line portion 209c is further separated from the juxtaposed region 208 through the separation portion 207k, the flown-out material forming the fuse may be configured to be prevented from flowing into the cut part 214a and the cut part 214b when the flowing-out region 212 is formed in the juxtaposed region 208.

Here, in the wide interconnect 207, a plurality of straight line portions and a plurality of connecting portions may be configured to have different interconnect widths from one another. For example, in the example shown in FIGS. 13A and 13B, the wide straight line portion 207d may be configured to have a thicker interconnect width than that of the wide straight line portion 207b and that of the wide straight line portion 207f. According to the above-described configuration, there may be a configuration in which flowing out is easily generated in the wide straight line portion 207d, and, at the same time, cutting is hardly generated in the wide straight line portion 207d. Here, a straight line portion and a connecting portion, which form the wide interconnect 207, are formed so that their interconnect width is formed wider than that of the narrow interconnect 209 even in any cases. Moreover, it is preferable in the wide interconnect 207 that differences in the interconnect width between each straight line portions and connecting portions do not change largely. The differences in the interconnect width between straight line portions and connecting portions in the wide interconnect 207 are preferably within a range of, for example, 30%.

As described above, according to the semiconductor device 100 in the present embodiment, the material forming may easily flow out to the outside by promoted crack generation, and, at the same time, a cut part may be formed separated from the flowing-out region, when the electric fuse 200 is cut by the crack assist type cutting, to prevent the electric fuse 200, which has been cut by short circuit between the interconnects, from conducting.

SECOND EMBODIMENT

Figure 14A:
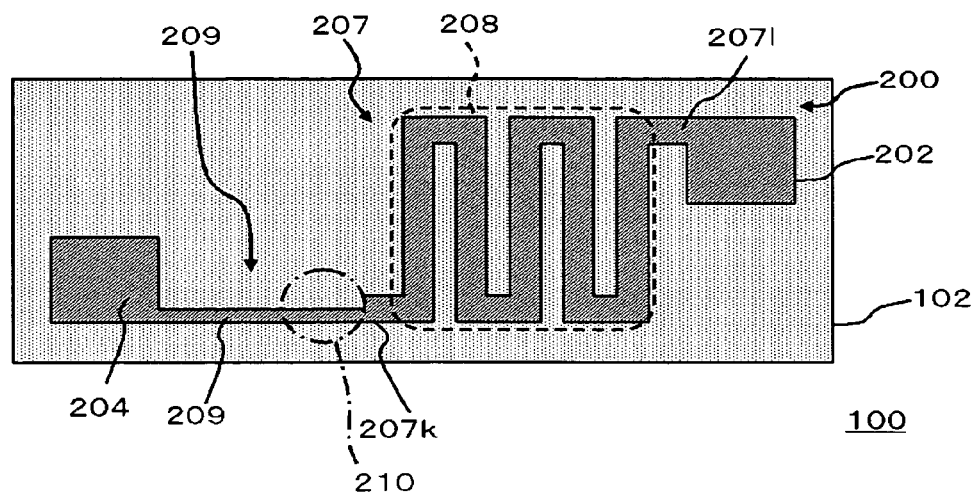
FIGS. 14A and 14B are plan views showing another example of a configuration of the semiconductor device according to the embodiment of the present invention.
Figure 14B:
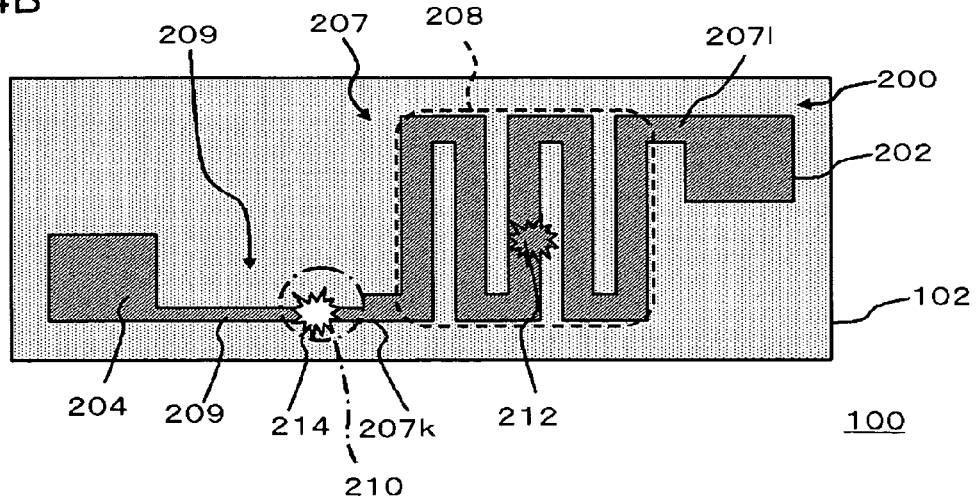

FIGS. 14A and 14B are plan views showing one example of the configuration of the semiconductor device 100 according to the present embodiment. FIG. 14A shows one example of the configuration of the electric fuse 200 before cutting, and FIG. 14B shows one example of the configuration of the electric fuse 200 after cutting.

The configuration of the present embodiment is different from that of the electric fuse 200 shown in the first embodiment in a point that the narrow interconnect 209 is provided only on the side of the second terminal 204, and the wide interconnect 207 is directly connected to the first terminal 202. Here, the wide connecting portion 207l, the folded structure of the wide interconnect 207, the separation portion 207k, and the narrow interconnect 209 are connected in this order between the first terminal 202 and the second terminal 204.

In the above-described configuration, the expected cut region 210 is provided on the narrow interconnect 209. Moreover, there is a high possibility, as shown in FIG. 14B, that the cut part 214 is formed on the narrow interconnect.

Figure 15A:
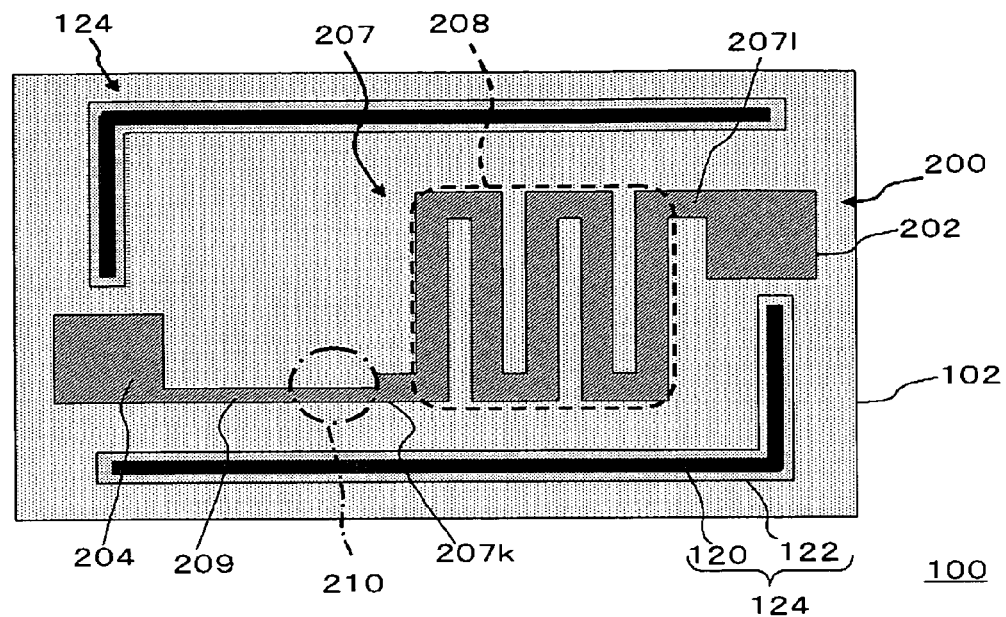
FIGS. 15A and 15B are plan views showing another example of a configuration of the semiconductor device according to the embodiment of the present invention.
Figure 15B:
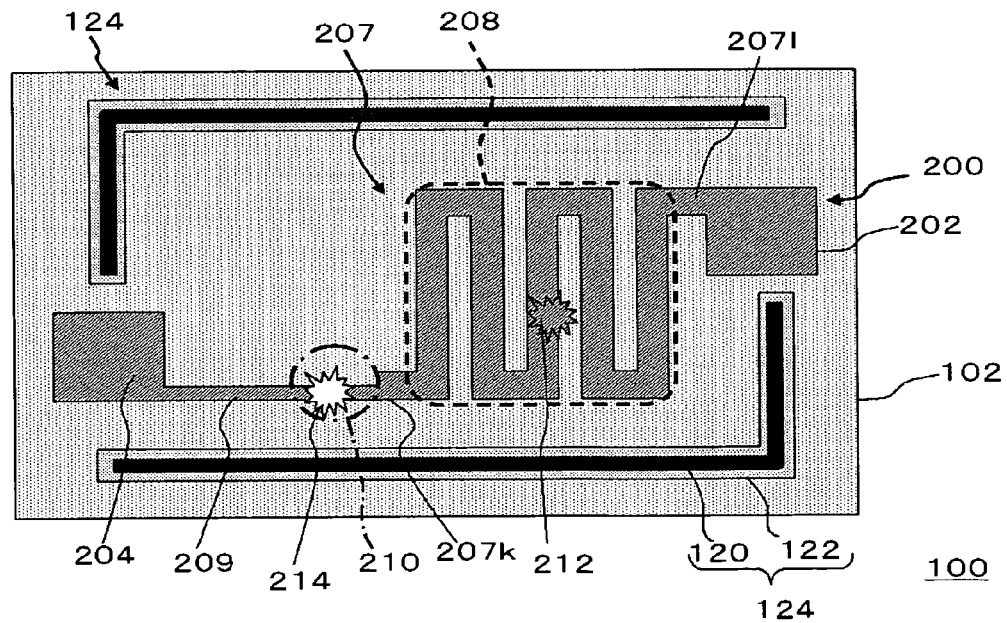

FIGS. 15A and 15B are plan views showing another example of the configuration of the semiconductor device 100 according to the present embodiment. FIG. 15A shows one example of the configuration of the electric fuse 200 before cutting, and FIG. 15B shows one example of the configuration of the electric fuse 200 after cutting.

The electric fuse 200 has a similar configuration to that of the fuse shown in FIGS. 14A and 14B.

The semiconductor device 100 has a configuration in which the electric fuse 200 is covered with a cover member 124, wherein the cover member 124 has an upper surface, lower surface, and a side surfaces, which are formed with a second conductive member separated from the conductive member 206 forming the electric fuse 200.

Hereinafter, the configuration of the cover member 124 will be explained. The cover member 124 includes vias 120, electrodes 122, and plates (not shown). The electrode 122 may be formed as a pad electrode which is formed in the same level as that of the conductive member 206 in the electric fuse 200. Moreover, the via 120 is formed on the upper layer and the lower layer of the electrode 122, and, furthermore, connects plates formed on the upper layer and the lower layer, and the electrode 122. The via 120 may be of a slit via, and the via 120 and the electrode 122 may be configured to cover the surrounding of the conductive member 206 like a wall.

Thereby, the heat generated in the electric fuse 200 when a current is applied to between the first terminal 202 and the second terminal 204 may be confined in the inside of the cover member 124 by reflecting the heat with the cover member 124. Accordingly, the semiconductor device 100 may have a configuration in which a crack 110 may be easily generated, and, at the same time, the conductive member 206 may be easily cut. Moreover, when the conductive member 206 is cut, the material forming the conductive member 206 may be prevented by using the cover member 124 from being scattered in the surrounding. Thereby, scattered matters of the material forming the conductive member 206 may be prevented from reaching other elements.

Here, the cover member 124 may have a structure, as explained above, in which the top surface, the bottom one, the right side one, and the left side one of the electric fuse 200 may be completely enclosed. However, the structure is not limited to the above one, and, for example, a structure in which only a part of the electric fuse 200 is covered may be applied.

Though the present embodiment has shown the configuration in which the narrow interconnect 209 is provided only on the side of the second terminal 204, there may be applied a configuration in which the narrow interconnect 209 is provided only on the side of the first terminal 202.

Even the present embodiment may obtain the similar effects to those explained in the first embodiment.

THIRD EMBODIMENT

Figure 16:
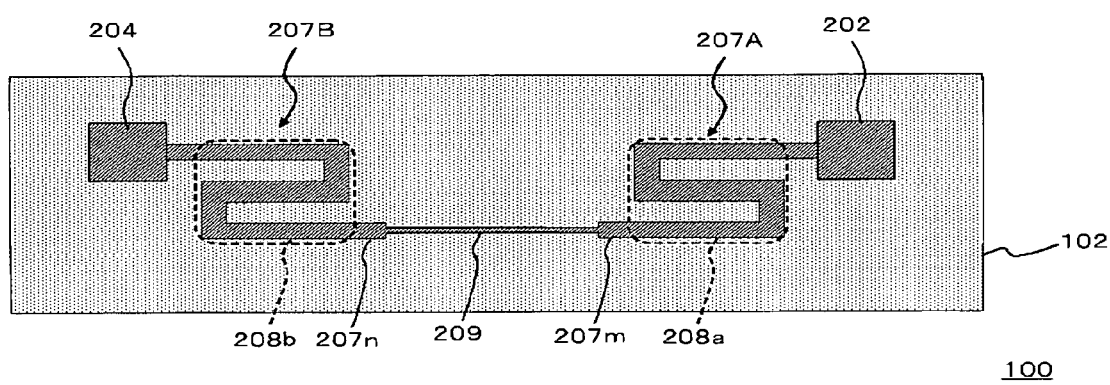
FIG. 16 is a plan view showing another example of a configuration of the semiconductor device according to the embodiment of the present invention.

FIG. 16 is a plan view showing one example of the configuration of the semiconductor device 100 according to the present embodiment. Here, the drawing shows one example of the configuration of the electric fuse 200 before cutting.

The electric fuse 200 of the present embodiment is different from that in the semiconductor device 100 shown in the first and second embodiments in a point that the wide interconnect 207A with the folded structure is connected to the first terminal 202, the wide interconnect 207B with the folded structure is connected to the second terminal 204, and the narrow interconnect 209 is provided between the wide interconnect 207A and the wide interconnect 207B. The wide interconnect 207A has a structure in which the separation portion 207m is provided at the connecting portion to the narrow interconnect 209, and the wide interconnect 207B has a structure in which the separation portion 207n is provided at the connecting portion to the narrow interconnect 209.

According to the above-described configuration, the fuse forming material may easily flow out in the juxtaposed region 208a of the wide interconnect 207A and that juxtaposed region 208b of the wide interconnect 207B. When the fuse forming material flows out in both of the juxtaposed region 208a and the juxtaposed region 208b, the fuse forming material moves to both sides in the narrow interconnect 209 to easily form a larger cut part. Here, when a narrow interconnect is provided in the juxtaposed region 208a and the juxtaposed region 208b, cutting is easily executed thereon. When a method by which a part of the electric fuse 200 flows out and the electric fuse 200 is cut is used, and if the flowing-out region nor the cut part are not separated from each other, there is a possibility, as described above, that reconnection is generated at the cut part, or a short circuit between the interconnects is generated at a location excluding the cut part. In the present embodiment, the flowing-out region of the fuse forming material and the cut part of the electric fuse 200 may be formed in different places, because the narrow interconnect 209 is arranged away from the juxtaposed region 208a and the juxtaposed region 208b, using the separation portion 207m and the separation portion 207n.

Even the present embodiment may obtain the similar effects to those explained in the first embodiment.

Though the embodiments according to the present invention have been described with reference to the drawings, the above embodiments are only illustrative and not restrictive, and various kinds of configurations excluding the above-described ones may be adopted.

Figure 17:
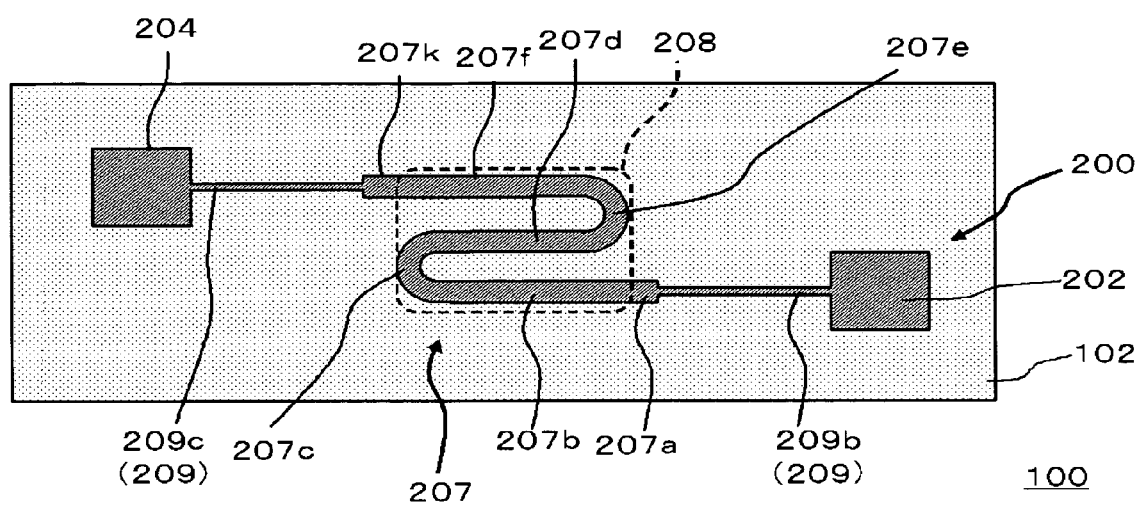
FIG. 17 is a plan view showing another example of a configuration of the semiconductor device according to the embodiment of the present invention.

Though the above-described embodiments have shown a configuration in which the wide interconnect 207 is folded into a horizontally-tilted shape at a folded location in the electric fuse 200, there may be applied a configuration in which the wide interconnect 207 is folded into a U-shape at a folded location as shown in FIG. 17, assuming that the wide connecting portion 207c and the wide connecting portion 207e have a curved shape.

Figure 18:
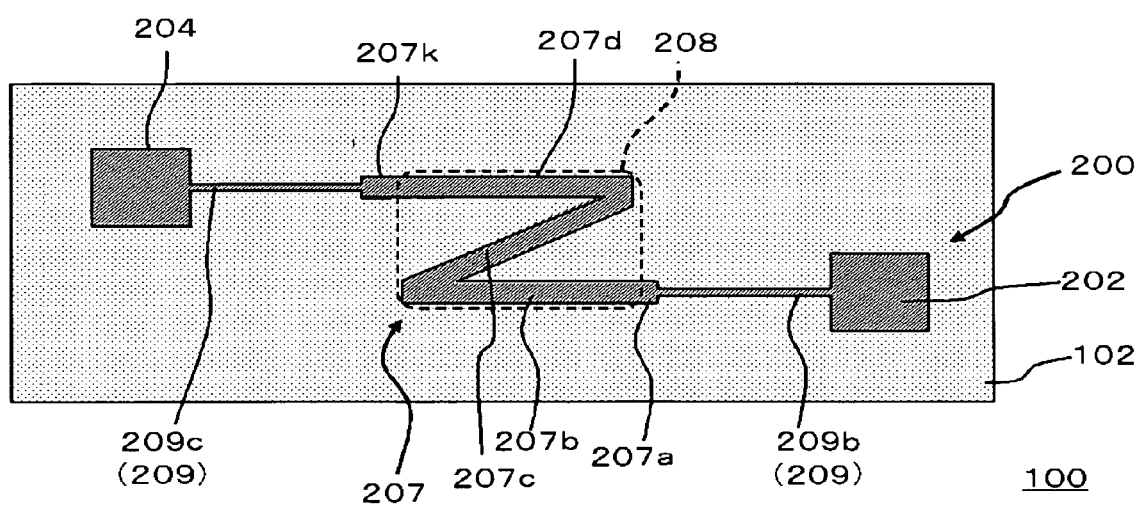
FIG. 18 is a plan view showing another example of a configuration of the semiconductor device according to the embodiment of the present invention.

Moreover, though the configuration in which the adjacent straight line portions are arranged approximately in parallel with one another at the folded location of the wide interconnect 207 has been shown in the above-described embodiments, there may be applied a configuration in which the wide straight line portion 207b and the wide straight line portion 207d, which are arranged approximately in parallel with each other, are connected to each other like a cross-belt as shown in FIG. 18, using the wide connecting portion 207c. Here, the wide interconnect 207 may be formed into a zigzag structure in which the line is folded into a Z-shape. In this example, the wide straight line portion 207b and the wide connecting portion 207c, and the wide connecting portion 207c and the wide straight line portion 207d are respectively juxtaposed.

Figure 19A:
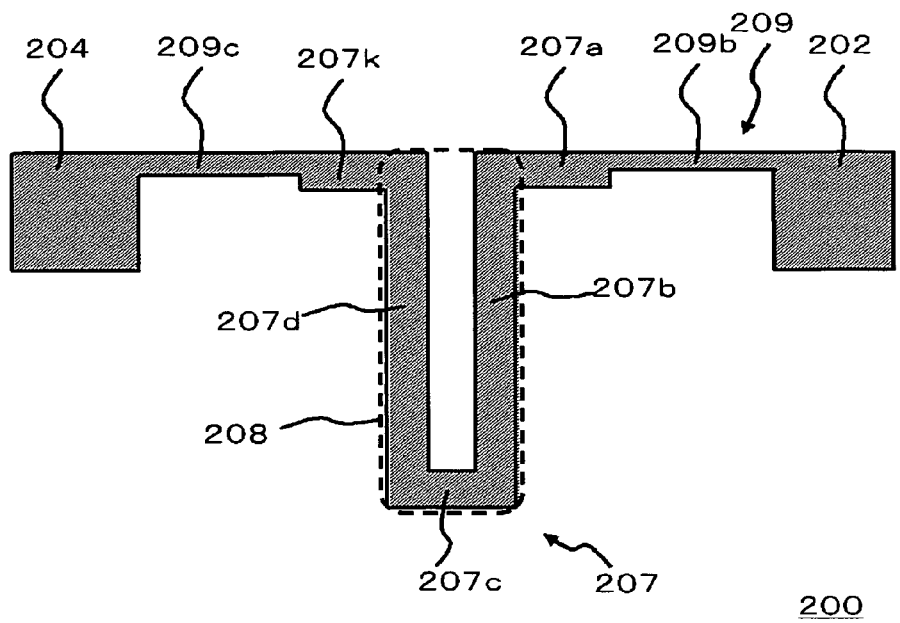
FIGS. 19A and 19B are plan views showing another example of a configuration of the electric fuse.
Figure 19B:
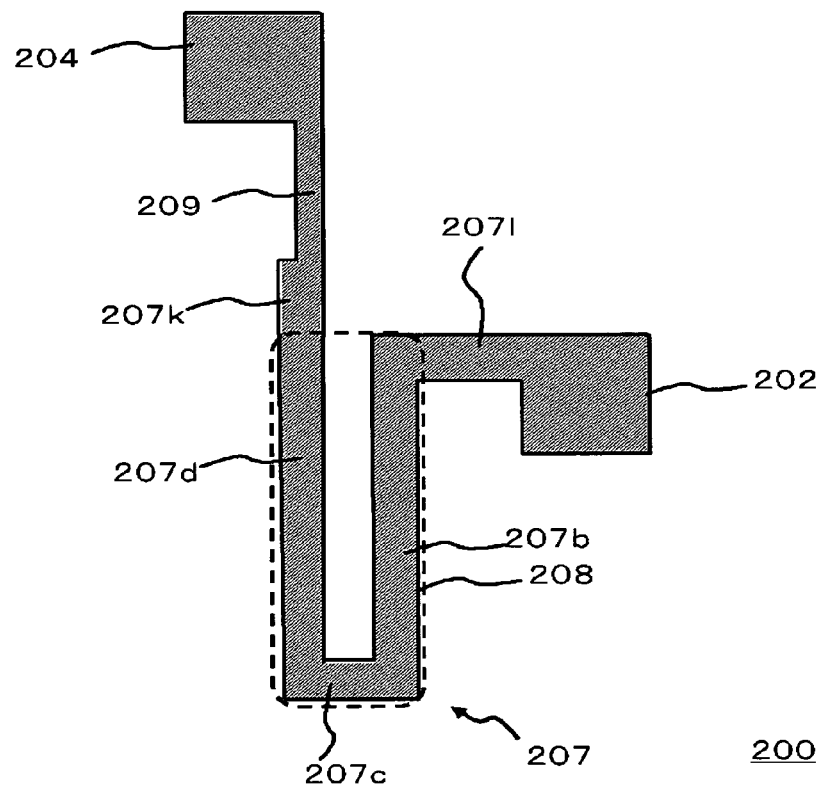

Moreover, though the above-described embodiments have shown the configuration in which the wide interconnect 207 is folded a plurality of times, the electric fuse 200 may have a configuration in which the wide interconnect 207 is folded only once in the juxtaposed region 208. As the wide straight line portion 207b and the wide straight line portion 207d are adjacent to each other, even in the configuration in which the wide interconnect 207 is folded only once as shown in FIGS. 19A and 19B, the fuse forming material is easily heated at the location in which the portions are adjacent to each other, and there is a higher possibility that the fuse forming material flows out. As cutting may be configured not to be generated in the juxtaposed region 208 by widening the width of the wide interconnect 207, a short circuit between interconnects may be prevented without a widened distance between the wide straight line portion 207b and the wide straight line portion 207d. There may be applied a configuration in which the narrow interconnect 209 is provided only on the side of the second terminal 204 as shown in FIG. 19B. Here, the first terminal 202 is connected to the wide straight line portion 207b through the wide connecting portion 207l. Moreover, there may be adopted a configuration in which the narrow interconnect 209 is provided only on the side of the first terminal 202, though the configuration is not shown.

Furthermore, though the configuration in which the semiconductor device 100 has the cover member 124 has been shown in the second embodiment with reference to FIGS. 15A and 15B, there may be applied in other embodiments a configuration in which the semiconductor device 100 has a cover member 124.

In the above-described embodiments, there has been a configuration in which the first coating layer 106 is formed on the upper surface of the conductive member 206, and other portions excluding the above surface are covered with the second coating layer 104 as shown in FIG. 5. But the first coating layer 106 may be configured to be provided on portions excluding the upper surface of the conductive member 206. The semiconductor device 100 may have, for example, a configuration in which, in the cross-section in the stacking direction of the semiconductor substrates (not shown), the first coating layer 106 is formed on a part of the surface region of the conductive member 206, and, at the same time, the second coating layer 104 is formed on the rest of the surface region.

Here, though the above-described embodiments have shown the example in which the electric fuse 200 is cut by the crack assist type cutting, a location which is easily heated, and a cut part may be formed at different locations from each other, and a state of a cut electric fuse may be preferably held, even when the electric fuse 200 with the configuration explained in the above-described embodiments is cut by conventional meltdown, electro-migration and the like.

It is apparent that the present invention is not limited to the above embodiment, and may be modified and changed without departing from the scope and spirit of the invention.

What is claimed is:

1. A semiconductor device, comprising:
   a semiconductor substrate; and
   an electric fuse which is formed on said semiconductor substrate, and includes a first interconnect and a second interconnect,
   wherein said electric fuse has a region in which a plurality of straight line portions are juxtaposed with each other by folding said first interconnect, and
   said second interconnect has a narrower width than that of said first interconnect and is connected to said first interconnect outside said region.

2. The semiconductor device according to claim 1,
   wherein three straight line portions are juxtaposed with each other in said region by folding said first interconnect at least two times.

3. The semiconductor device according to claim 1,
   wherein said first interconnect is folded in said region in such a way that a first straight line portion, a second straight line portion, and a first connecting portion are included; said first straight line portion and said second straight line portion being arranged in substantially parallel with each other, and said first connecting portion connecting one end of said first straight line portion and one end of said second straight line portion.

4. The semiconductor device according to claim 3,
   wherein said first interconnect is folded in said region in such a way that a third straight line portion, and a second connecting portion are further included; said third straight line portion being arranged in substantially parallel with said first straight line portion; said second straight line portion being arranged between said third straight line portion and said first straight line portion, and said second connecting portion connecting one end of said third straight line portion and the other end of said second straight line portion.

5. The semiconductor device according to claim 3,
wherein said first straight line portion has an extending portion which is extending longer than said second straight line portion at the side of the other end of said first straight line portion, and
said second interconnect is connected to said other end of said first straight line portion.

6. The semiconductor device according to claim 4,
wherein said first straight line portion has an extending portion which is extending longer than said second straight line portion at the side of the other end of said first straight line portion, and
said second interconnect is connected to said other end of said first straight line portion.

7. The semiconductor device according to claim 3,
wherein said first interconnect further includes a third connecting portion one end of which is connected to the other end of said first straight line portion, and which is extending in a direction approximately perpendicular to the extending direction of said first straight line portion, and in a leaving direction from said second straight line portion, and
said second interconnect is connected to the other end of said third connecting portion.

8. The semiconductor device according to claim 4,
wherein said first interconnect further includes a third connecting portion one end of which is connected to the other end of said first straight line portion, and which is extending in a direction approximately perpendicular to the extending direction of said first straight line portion, and in a leaving direction from said second straight line portion, and
said second interconnect is connected to the other end of said third connecting portion.

9. The semiconductor device according to claim 1,
wherein said first interconnect further includes a separation portion which is formed between said region and said second interconnect, and separates said second interconnect from said region, and
said second interconnect is connected to said separation portion.

10. The semiconductor device according to claim 2,
wherein said first interconnect further includes a separation portion which is formed between said region and said second interconnect, and separates said second interconnect from said region, and
said second interconnect is connected to said separation portion.

11. The semiconductor device according to claim 3,
wherein said first interconnect further includes a separation portion which is formed between said region and said second interconnect, and separates said second interconnect from said region, and
said second interconnect is connected to said separation portion.

12. The semiconductor device according to claim 4,
wherein said first interconnect further includes a separation portion which is formed between said region and said second interconnect, and separates said second interconnect from said region, and
said second interconnect is connected to said separation portion.

13. The semiconductor device according to claim 1,
wherein said first interconnect and said second interconnect are formed with a copper containing metal layer including copper as a main constituent.

14. The semiconductor device according to claim 1, further including:
a first insulating layer which is formed on said semiconductor substrate and which is formed with a concave portion;
a first coating layer which is formed at least on the upper surface of said first interconnect; and
a second coating layer which is formed on the side surfaces and the bottom surface of said concave portion, and is different from said first coating layer,
wherein said first interconnect and said second interconnect are formed in such a way to embed said concave portion and said first interconnect is formed on said second coating layer in said concave portion.

15. The semiconductor device according to claim 14, further including:
a second insulating layer which is formed with a material whose young's modulus is lower than that of said first coating layer, and is formed on said first coating layer.

16. The semiconductor device according to claim 14,
wherein said first coating layer is formed with a material having a lower young's modulus than that of said second coating layer.

17. The semiconductor device according to claim 15,
wherein said first coating layer is formed with a material having a lower young's modulus than that of said second coating layer.

18. The semiconductor device according to claim 14,
wherein a flowing-out region in which a material forming said first interconnect flows out into the outside of said concave portion is formed in said region.

19. The semiconductor device according to claim 18,
wherein a crack is formed in said first coating layer, and
said flowing-out region is formed by flowing out of a material forming said first interconnect into said crack.

* * * * *

UNITED STATES PATENT AND TRADEMARK OFFICE
CERTIFICATE OF CORRECTION

| | | |
|---|---|---|
| PATENT NO. | : 7,619,264 B2 | Page 1 of 1 |
| APPLICATION NO. | : 11/514143 | |
| DATED | : November 17, 2009 | |
| INVENTOR(S) | : Takehiro Ueda | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 380 days.

Signed and Sealed this

Fourteenth Day of December, 2010

David J. Kappos
*Director of the United States Patent and Trademark Office*